(12) United States Patent
Kandanarachchi et al.

(10) Patent No.: US 11,535,709 B2
(45) Date of Patent: *Dec. 27, 2022

(54) REACTIVE END GROUP CONTAINING POLYIMIDES AND POLYAMIC ACIDS AND PHOTOSENSITIVE COMPOSITIONS THEREOF

(71) Applicant: PROMERUS, LLC, Brecksville, OH (US)

(72) Inventors: Pramod Kandanarachchi, Brecksville, OH (US); Cheryl Burns, Brecksville, OH (US); Brian Knapp, Brecksville, OH (US); Larry F Rhodes, Brecksville, OH (US)

(73) Assignee: PROMERUS, LLC, Akron, OH (US)

( * ) Notice: Subject to any disclaimer, the term of this patent is extended or adjusted under 35 U.S.C. 154(b) by 364 days.

This patent is subject to a terminal disclaimer.

(21) Appl. No.: 16/809,556

(22) Filed: Mar. 5, 2020

(65) Prior Publication Data

US 2020/0283579 A1 Sep. 10, 2020

Related U.S. Application Data

(60) Provisional application No. 62/813,931, filed on Mar. 5, 2019.

(51) Int. Cl.
*C08G 73/10* (2006.01)
*G03F 7/038* (2006.01)

(52) U.S. Cl.
CPC ......... *C08G 73/101* (2013.01); *C08G 73/105* (2013.01); *C08G 73/1017* (2013.01); *C08G 73/1025* (2013.01); *C08G 73/1032* (2013.01); *C08G 73/1042* (2013.01); *C08G 73/1078* (2013.01); *C08G 73/1085* (2013.01); *G03F 7/0387* (2013.01)

(58) Field of Classification Search
None
See application file for complete search history.

(56) References Cited

U.S. PATENT DOCUMENTS

| | | | |
|---|---|---|---|
| 2002/0093077 A1 | 7/2002 | Jung et al. | |
| 2003/0064235 A1 | 4/2003 | Okawa et al. | |
| 2011/0130485 A1* | 6/2011 | Mizori | C08G 73/12 522/167 |
| 2015/0219990 A1* | 8/2015 | Malik | G03F 7/0387 428/375 |
| 2017/0298186 A1* | 10/2017 | Takemura | C08G 73/126 |

FOREIGN PATENT DOCUMENTS

JP 2005089659 A * 4/2005

* cited by examiner

*Primary Examiner* — Rachel Kahn
(74) *Attorney, Agent, or Firm* — Balaram Gupta

(57) ABSTRACT

Embodiments in accordance with the present invention encompass polyamic acid or polyimide polymers containing a reactive maleimide end group as well as photosensitive compositions made therefrom which are useful for forming films that can be patterned to create structures for microelectronic devices, microelectronic packaging, microelectromechanical systems, optoelectronic devices and displays. In some embodiments the compositions of this invention are shown to feature excellent hitherto unachievable mechanical properties. The negative images formed therefrom exhibit improved thermo-mechanical properties, among other property enhancements.

20 Claims, 2 Drawing Sheets

REACTIVE END GROUP CONTAINING POLYIMIDES AND POLYAMIC ACIDS AND PHOTOSENSITIVE COMPOSITIONS THEREOF

CROSS REFERENCE TO RELATED APPLICATIONS

This application claims the benefit of U.S. Provisional Application No. 62/813,931, filed Mar. 5, 2019, which is incorporated herein by reference in its entirety.

BACKGROUND OF THE INVENTION

Field of the Invention

The present invention relates to a series of polyamic acid and polyimide polymers. More specifically, the present invention relates to a series of reactive end group capped polyamic acid and polyimide polymers, and the photosensitive compositions made therefrom. Even more specifically, the polyamic acid and polyimide polymers are end capped with a substituted maleimide. The compositions made from the polymers of this invention are useful for forming microelectronic and/or optoelectronic devices and assemblies thereof, and more specifically, such compositions exhibit improved thermal, mechanical and opto-electronic properties.

Description of the Art

Organic polymer materials are increasingly being used in the microelectronics and optoelectronics industries for a variety of applications. For example, the uses for such organic polymer materials include permanent interlevel dielectrics, redistribution layers (RDL), stress buffer layers, chip stacking and/or bonding, leveling or planarization layers, alpha-particle barriers, passivation layers, among others, in the fabrication of a variety of microelectronic and optoelectronic devices. Where such organic polymer materials are photosensitive, thus self-imageable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS), microoptoelectromechanical systems (MOEMS) and the semiconductor device encompassing a complementary metal oxide semiconductor (CMOS) image sensor dam structure, and the like.

There has been innumerable polymeric materials used in the art in order to achieve the above noted desired requirements. One such class of polymers include polyimides and its precursor, polyamic acid. However, most of the polyimides disclosed in the art are generally for positive tone image forming films, and may not be suitable for many applications. Some of the drawbacks include use of highly toxic and corrosive phenolic monomers which provide alkali solubility that is required for forming positive tone compositions. Other property disadvantages include insolubility of the polyimides and/or the precursor polyamic acids in commonly used solvents in the electronic industry, poor photo imaging capabilities, among others. Even more importantly, such compositions suffer from poor thermo-mechanical properties and may require high cure temperatures, often times higher than 300° C., which are undesirable. See for example, U.S. Pat. No. 8,946,852 B2 and U.S. Pat. No. 7,485,405 B2.

Accordingly, it is an object of this invention to provide a series of polyamic acid and polyimide polymers and their compositions that provide improved thermo-mechanical properties.

It is also an object of this invention to provide compositions which can be cured at lower temperature that exhibit improved thermo-mechanical properties.

Other objects and further scope of the applicability of the present invention will become apparent from the detailed description that follows.

SUMMARY OF THE INVENTION

Surprisingly, it has now been found that incorporating substituted maleimide as an end capped group for forming a series of polyamic acid and polyimide polymers as described herein provides hitherto unattainable thermo-mechanical properties, among other property advantages. More specifically, the polyamic acid and polyimide polymers as disclosed herein can be made by employing any of the known dianhydrides and diamines in combination with a substituted aminoalkyl maleimide to produce maleimide end group containing polyamic acid or polyimide, which are soluble in commonly used organic solvents. The polymers of this invention can then be combined with a number of additives to form photosensitive compositions which feature excellent thermo-mechanical properties, photo-imaging properties, low cure temperatures, generally below 250° C. or lower, among other property enhancements.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

DETAILED DESCRIPTION OF THE INVENTION

Figure 1:
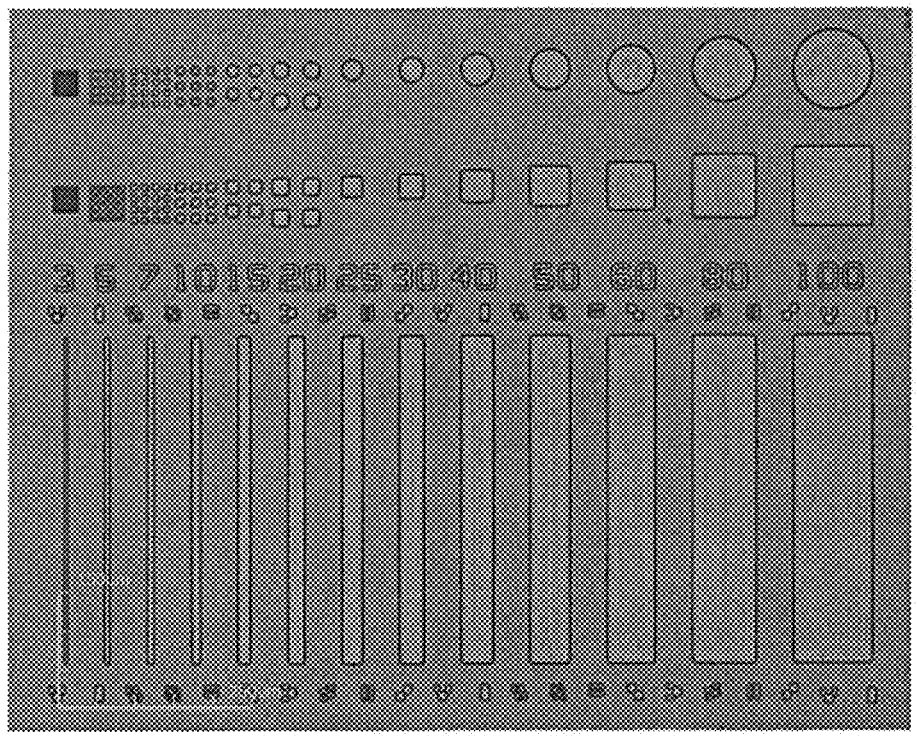
FIG. 1, FIG. 3 and FIG. 4 show photolithographic images formed from various composition embodiments of this invention.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to include, but are not limited to, 1 to 6.1, 3.5 to 7.8, and 5.5 to 10, etc.

As used herein, the expression "alkyl" means a saturated, straight-chain or branched-chain hydrocarbon substituent having the specified number of carbon atoms. Particular alkyl groups are methyl, ethyl, n-propyl, isopropyl, tert-butyl, and so on. Derived expressions such as "alkoxy", "thioalkyl", "alkoxyalkyl", "hydroxyalkyl", "alkylcarbonyl", "alkoxycarbonylalkyl", "alkoxycarbonyl", "diphenylalkyl", "phenylalkyl", "phenylcarboxyalkyl" and "phenoxyalkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "perhaloalkyl" represents the alkyl, as defined above, wherein all of the hydrogen atoms in said alkyl group are replaced with halogen atoms selected from fluorine, chlorine, bromine or iodine. Illustrative examples include trifluoromethyl, trichloromethyl, tribromomethyl, triiodomethyl, pentafluoroethyl, pentachloroethyl, pentabromoethyl, pentaiodoethyl, and straight-chained or branched heptafluoropropyl, heptachloropropyl, heptabromopropyl, nonafluorobutyl, nonachlorobutyl, undecafluoropentyl, undecachloropentyl, tridecafluorohexyl, tridecachlorohexyl, and the like. Derived expression, "perhaloalkoxy", is to be construed accordingly. It should further be noted that certain of the alkyl groups as described herein, such as for example, "alkyl" may partially be fluorinated, that is, only portions of the hydrogen atoms in said alkyl group are replaced with fluorine atoms and shall be construed accordingly.

As used herein the expression "acyl" shall have the same meaning as "alkanoyl", which can also be represented structurally as "R—CO—," where R is an "alkyl" as defined herein having the specified number of carbon atoms. Additionally, "alkylcarbonyl" shall mean same as "acyl" as defined herein. Specifically, "$(C_1-C_4)$acyl" shall mean formyl, acetyl or ethanoyl, propanoyl, n-butanoyl, etc. Derived expressions such as "acyloxy" and "acyloxyalkyl" are to be construed accordingly.

As used herein, the expression "aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art.

As used herein, the expression "arylalkyl" means that the aryl as defined herein is further attached to alkyl as defined herein. Representative examples include benzyl, phenylethyl, 2-phenylpropyl, 1-naphthylmethyl, 2-naphthylmethyl and the like.

As used herein, the expression "alkenyl" means a non-cyclic, straight or branched hydrocarbon chain having the specified number of carbon atoms and containing at least one carbon-carbon double bond, and includes ethenyl and straight-chained or branched propenyl, butenyl, pentenyl, hexenyl, and the like. Derived expression, "arylalkenyl" and five membered or six membered "heteroarylalkenyl" is to be construed accordingly. Illustrative examples of such derived expressions include furan-2-ethenyl, phenylethenyl, 4-methoxyphenylethenyl, and the like. As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, —$CO_2H$, an ester, an amide, $(C_1-C_6)$ alkoxy, $(C_1-C_6)$thioalkyl and $(C_1-C_6)$perfluoroalkoxy. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

It will be understood that the terms "dielectric" and "insulating" are used interchangeably herein. Thus reference to an insulating material or layer is inclusive of a dielectric material or layer and vice versa.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof.

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the terms "polymer composition," "copolymer composition," "terpolymer composition" or "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imageable compositions" will be understood to mean a material that is photodefinable and can thus provide patterned layers and/or structures after direct image-wise exposure of a film formed thereof followed by development of such images in the film using an appropriate developer.

By the term "derived" is meant that the polymeric repeating units are formed from, for example, condensation of a dianhydride with a diamine. That is, polyimide repeat units are derived from the corresponding dianhydride and diamine. Generally, such condensation reaction first results in a polyamic acid which is further condensed to form a polyimide as described further in detail below. Accordingly, a polyamic acid or a polyimide is generally derived from the condensation of equimolar amounts of at least one dianhydride with one diamine. When a mono-anhydride or a mono-amine is used off-setting the stoichiometry, the resulting polyimide will be end-capped with such excess amount of either the mono-anhydride or the mono-amine employed.

Thus, in accordance with the practice of this invention there is provided an end capped polyamic acid of the formula (IA) or an end capped polyimide of the formula (IB):

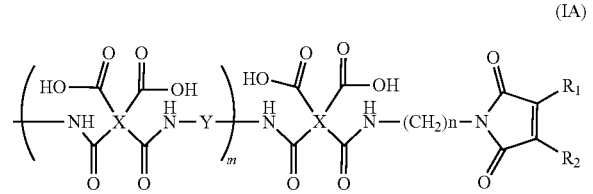

(IA)

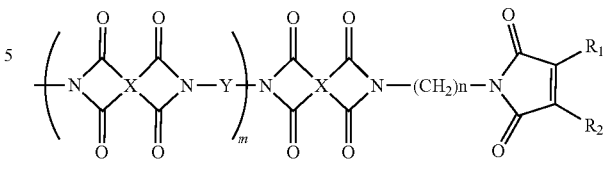

(IB)

wherein:

m is an integer of at least 50;

n is an integer from 1 to 12, inclusive;

X is one or more distinct tetravalent organic group;

Y is one or more distinct divalent organic group; and $R_1$ and $R_2$ are the same or different and each independently of one another selected from the group consisting of hydrogen, linear or branched $(C_1\text{-}C_{16})$alkyl, hydroxy$(C_1\text{-}C_2)$ allyl, perfluoro$(C_1\text{-}C_{12})$alkyl, $(C_6\text{-}C_{10})$aryl and $(C_6\text{-}C_{10})$aryl $(C_1\text{-}C_3)$alkyl provided that both $R_1$ and $R_2$ are not hydrogen; or $R_1$ and $R_2$ taken together with the carbon atoms to which they are attached to form a 5 to 7 membered monocyclic ring or 6 to 12 membered bicyclic ring, said ring optionally containing one or more heteroatoms selected from O, N and S, and said rings optionally substituted with one or more groups selected from the group consisting of linear or branched $(C_1\text{-}C_8)$alkyl, $(C_6\text{-}C_{10})$aryl, halogen, hydroxy, linear or branched $(C_1\text{-}C_8)$alkoxy and $(C_6\text{-}C_{10})$aryloxy; and wherein one or more of hydrogens of $(CH_2)$ is replaced with a group selected from the group consisting of halogen, hydroxy, linear or branched $(C_1\text{-}C_{16})$alkyl, linear or branched hydroxy$(C_1\text{-}C_{12})$alkyl, linear or branched perfluoro$(C_1\text{-}C_{12})$alkyl, $(C_6\text{-}C_{10})$aryl and $(C_6\text{-}C_{10})$aryl$(C_1\text{-}C_3)$ alkyl, linear or branched $(C_1\text{-}C_{16})$alkoxy and linear or branched perfluoro$(C_1\text{-}C_{12})$alkoxy.

The polyamic acid of formula (IA) or polyimide of formula (IB) of this invention can be synthesized by any of the procedures known to one skilled in the art. As noted above, such methods include condensation of one or more dianhydrides with one or more diamines essentially in equimolar ratios. Further, suitable amounts of substituted maleimide of formula (II) is employed to end cap the resulting polyamic acid or polyimide. Any of the dianhydrides or diamines in combination with substituted maleimide can be employed.

More specifically, the dianhydrides and the diamines that are suitable for forming the polyamic acid or polyimide of this invention can be represented by the following general formulae (IC) and (ID).

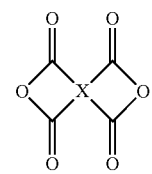

(IC)

$$H_2N\text{—}Y\text{—}NH_2 \quad \text{(ID)}$$

Wherein X and Y are as defined herein. Thus, any of the dianhydrides of tetracarboxylic acid in combination with any of the diamines can be employed to form the polyanic acid and subsequently the polyimides. Again, as noted, any of the techniques known in the art to make polyimides and/or polyamic acid can be employed herein in combination with desirable amounts of maleimide of formula (II).

Now turning specifically to X, any of the suitable tetravalent organic group can be employed herein. Non-limiting examples of such X may be selected from the group consisting of:

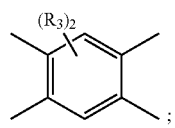
X-1

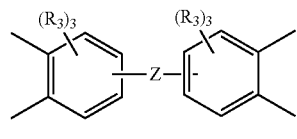
X-2

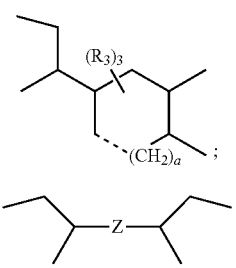
X-3

X-4 wherein
a is an integer from 0 to 4, inclusive;
≡≡≡ is a single bond or a double bond;
each of $R_3$ is independently selected from the group consisting of hydrogen, methyl, ethyl, linear or branched $(C_3-C_6)$alkyl, trifluoromethyl, pentafluoroethyl, linear or branched perfluoro$(C_3-C_6)$alkyl, methoxy, ethoxy, linear or branched $(C_3-C_6)$alkyloxy, $(C_2-C_6)$acyl, $(C_2-C_6)$acyloxy, phenyl and phenoxy;
Z is a divalent group selected from the group consisting of:
$(CR_4R_5)_b$, $O(CR_4R_5)_b$, $(CR_4R_5)_bO$, $(OCR_4R_5)_d$, $(CR_4R_5O)_d$, $(CR_4R_5)_b$—O—$(CR_4R_5)_c$, $(CR_4R_5)_b$—O—$(SiR_4R_5)_e$, $(CR_4R_5)_b$—(CO)O—$(CR_4R_5)_c$, $(CR_4R_5)_b$—O(CO)—$(CR_4R_5)_c$, $(CR_4R_5)_b$—(CO)—$(CR_4R_5)_c$, $(CR_4R_5)_b$—(CO)NH—$(CR_4R_5)_c$, $(CR_4R_5)_b$—NH(CO)—$(CR_4R_5)_c$, $(CR_4R_5)_b$—NH—$(CR_4R_5)_c$, where b and c are integers which may be the same or different and each independently is 0 to 12, and d is an integer from 1 to 12, inclusive;

$R_4$ and $R_5$ are the same or different and each independently selected from the group consisting of hydrogen, methyl, ethyl, linear or branched $(C_3-C_6)$alkyl, trifluoromethyl, pentafluoroethyl, linear or branched perfluoro$(C_3-C_6)$alkyl, methoxy, ethoxy, linear or branched $(C_3-C_6)$alkyloxy, $(C_2-C_6)$acyl, $(C_2-C_6)$acyloxy, phenyl and phenoxy.

Even more specifically, suitable dianhydrides may include the following:

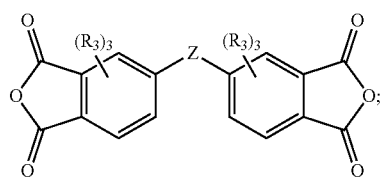
(X-1a)

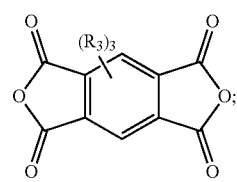
(X-1b)

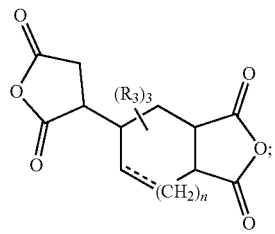
(X-1c)

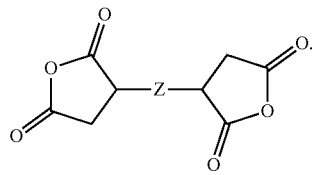
(X-1d)

Even more specifically, one or more of the dianhydrides of the following formulae can also be employed herein.

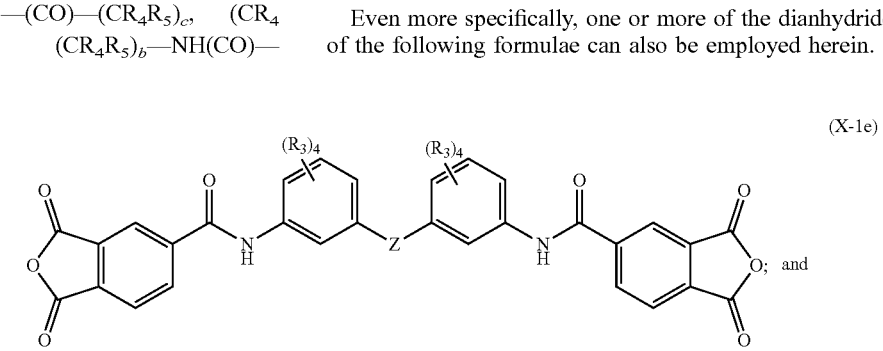
(X-1e)

; and (X-1f)

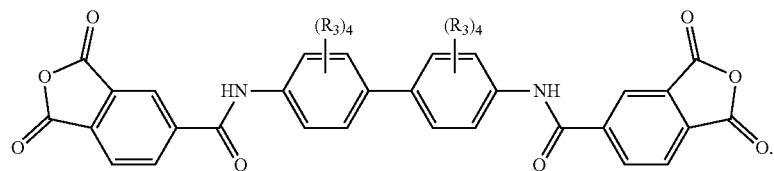

Where a, Z and $R_3$ are as defined herein.

In some embodiments, the polyimide or polyamic acid of this invention are formed using the dianhydrides where X is derived from one or more dianhydrides selected from the group consisting of:

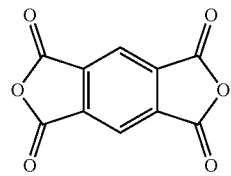

1H,3H-benzo[1,2-c:4,5-c′]difuran-1,3,5,7-tetraone (PMDA);

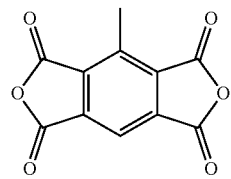

4-methyl-1H,3H-benzo[1,2-c:4,5-c′]difuran-1,3,5,7-tetraone;

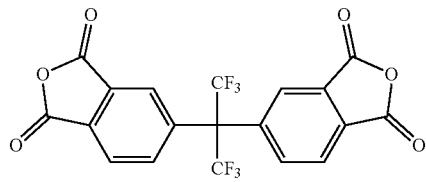

5,5′-(perfluoropropane-2,2-diyl)bis(isobenzofuran-1,3-dione) (6FDA);

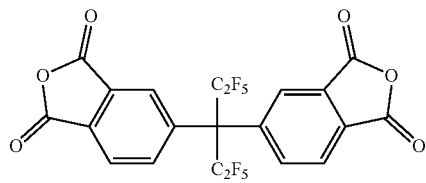

5,5′-(perfluoroentane-3,3-diyl)bis(isobenzofuran-1,3-dione);

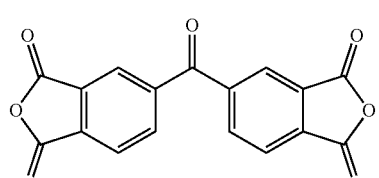

5,5′-carbonylbis(isobenzofuran-1,3-dione) (BTDA);

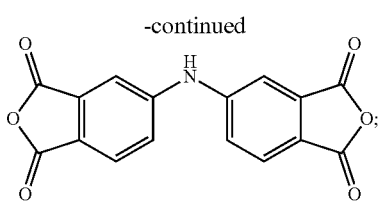

5,5′-azanediylbis(isobenzofuran-1,3-dione)

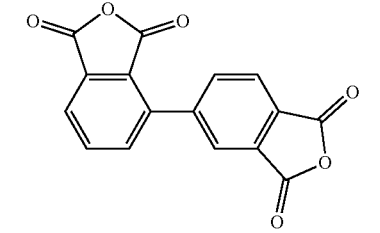

[4,5′-biisobenzofuran]-1,1′,3,3′-tetraone (α-BPDA);

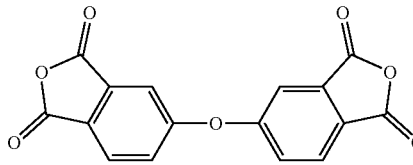

5,5′-oxybis(isobenzofuran-1,3-dione) (ODPA)

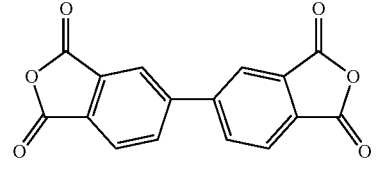

[5,5′-biisobenzofuran]-1,1′,3,3′-tetraone (α-BPDA); and

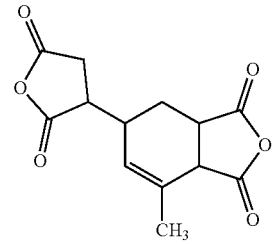

5-(2,5-dioxotetrahydrofuran-3-yl)-7-methyl-3a,4,5,7a-tetrahydroisobenzofuran-1,3-dione (D1901)

As noted, again, any of the diamines known in the art can be used to form the polyamide or polyamic acid of this invention. The diamines can again be broadly classified as aromatic diamines, aliphatic diamines or mixed aliphatic-aromatic diamines which contain a wide variety of bridging groups. A non-limiting generic types of diamines include the following:

(Y-1a)

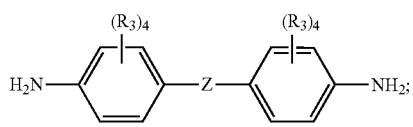

(Y-1b)

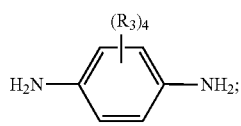

Where a, Z and $R_3$ are as defined herein.

In some embodiments, the polyimide or polyamic acid of this invention are formed using the diamines where Y is derived from one or more diamines selected from the group consisting of:

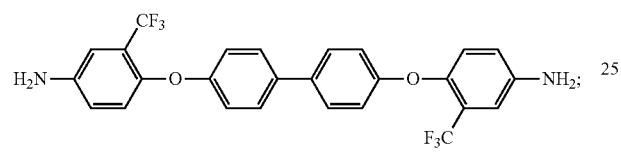

4,4'-([1,1'-biphenyl]-4,4'-diylbis(oxy))bis(3-trifluoromethyl)aniline) (6BF)

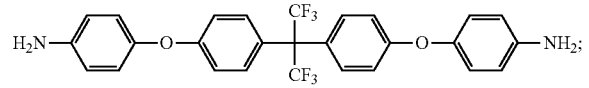

4,4'-(((perfluoropropane-2,2-diyl)bis(4,1-phenylene))bis(oxy))dianiline (HFBAPP)

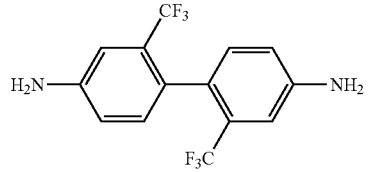

2,2'-bis(trifluoromethyl)-[1,1'-biphenyl]-4,4'-diamine (PFMB);

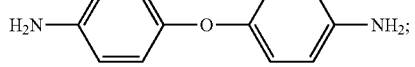

4,4'-oxydianiline (4,4'-ODA)

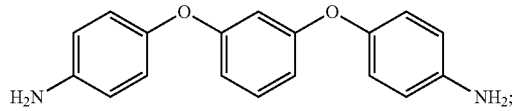

4,4'-(1,3-phenylenebis(oxy))dianiline (APB)

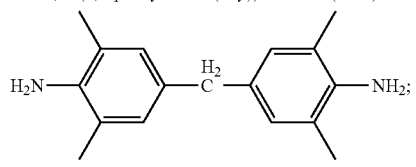

4,4'-methylenebis(2,6-dimethylaniline) (DO3)

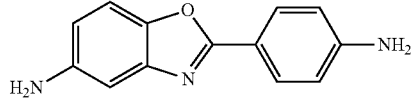

2-(4-aminophenyl)benzo[d]oxazol-5-amine (BZXPh-5);

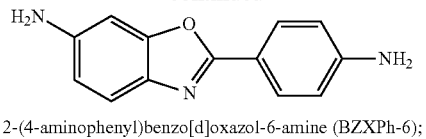

2-(4-aminophenyl)benzo[d]oxazol-6-amine (BZXPh-6);

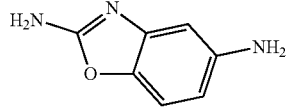

benzo[d]oxazole-2,6-diamine (BZX-5);

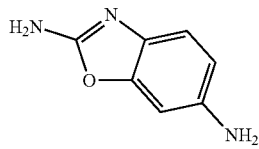

benzo[d]oxazole-2,6-diamine (BZX-6);

bicyclo[2.2.1]heptane-2,5-diyldimethanamine (NBDA)
a diamine of formula (IIIA)

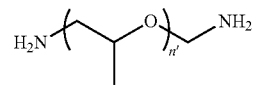

(IIIB) where, n' = 2 to 6 (JD-230);

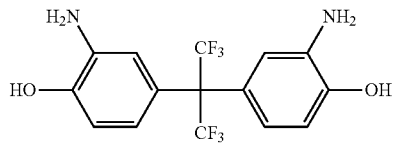

4,4'-(perfluoropropane-2,2-diyl)bis(2-aminophenol) (BAFA); and

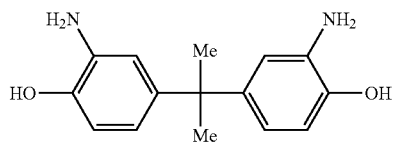

4,4'-(propane-2,2-diyl)bis(2-aminophenol) (DABPA).

As noted, the polyamic acid or polyimide of this invention are end capped with a suitable alkylamino maleimide compound. A suitable end capped alkylamino maleimide group is derived from a compound of formula (II):

(II)

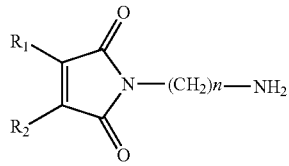

wherein n, $R_1$ and $R_2$ are as defined above.

Scheme 1

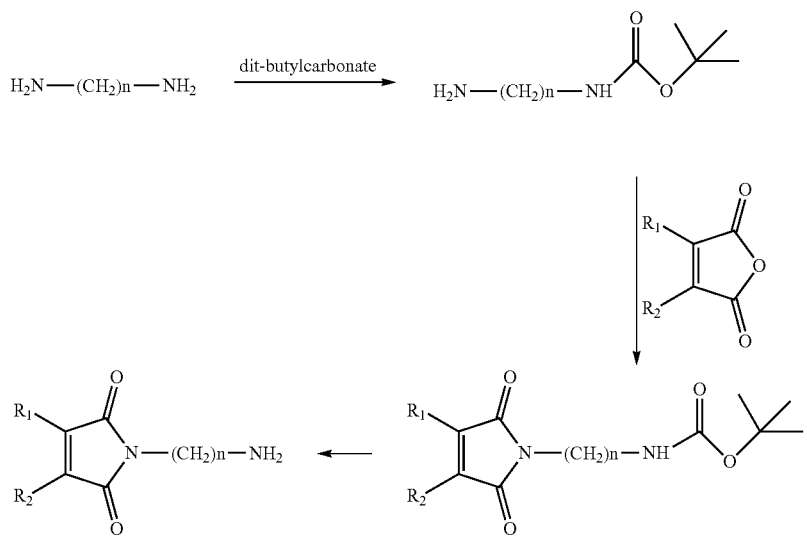

The compounds of formula (II) can be readily prepared by any of the methods known in the art. For example, D. Roy, et al., Macromol. Rapid Commun. 2014, 35, 174-179, disclose a method for the preparation of a compound of formula (II), where n=2 and $R_1$ and $R_2$ are each methyl. Similar preparative methods can be used to make various other compounds of formula (II) by employing suitable starting materials as shown in Scheme I.

Again, any of the alkylamino maleimide compound of formula (II) that will bring about the intended benefit can be employed herein. Non-limiting examples of the compound of formula (II) is selected from the group consisting of:

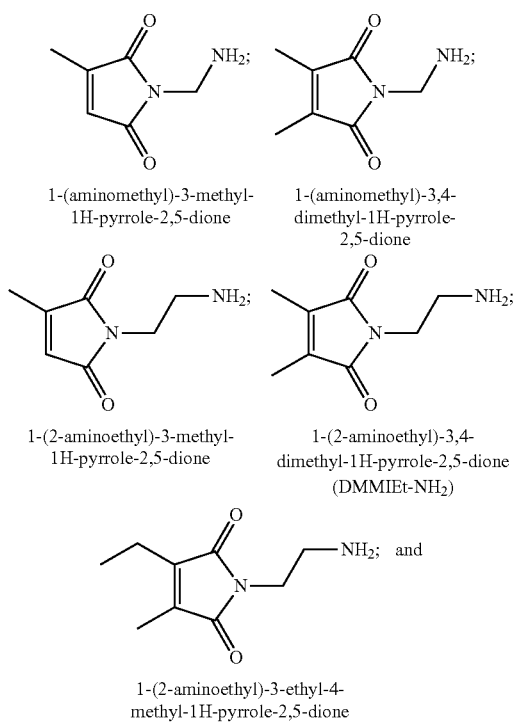

1-(aminomethyl)-3-methyl-1H-pyrrole-2,5-dione 1-(aminomethyl)-3,4-dimethyl-1H-pyrrole-2,5-dione 1-(2-aminoethyl)-3-methyl-1H-pyrrole-2,5-dione 1-(2-aminoethyl)-3,4-dimethyl-1H-pyrrole-2,5-dione (DMMIEt-NH$_2$)

1-(2-aminoethyl)-3-ethyl-4-methyl-1H-pyrrole-2,5-dione

-continued

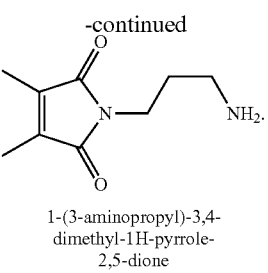

1-(3-aminopropyl)-3,4-dimethyl-1H-pyrrole-2,5-dione

The polyamic acid or the polyimide of this invention having suitable molecular weight can be tailored based on the intended application by employing appropriate polycondensation methods. Accordingly, in some embodiments the number of repeat units, m, in the resulting polyamic acid or the polyimide is at least 50; in some other embodiments m is at least 100, 500, 1000, 2000 or higher. In some embodiments m is from 50 to 2000, inclusive. The degree of polycondensation can be measured by determining the molecular weight of the resulting polyamic acid or the polyimide using any of the known methods in the art, such as for example, by gel permeation chromatography (GPC) equipped with suitable detector and calibration standards, such as differential refractive index detector calibrated with narrow-distribution polystyrene standards. Accordingly, the polyamic acid or the polyimide of this invention generally exhibit a weight average molecular weight ($M_w$) of at least about 5,000. In some other embodiments, the polyamic acid or polyimide as described herein exhibit a weight average molecular weight ($M_w$) of at least about 20,000. In some other embodiments, the polyamic acid or polyimide made in accordance of this invention has a $M_w$ of at least about 50,000. In yet another embodiment, the polyamic acid or polyimide of this invention has a $M_w$ of at least about 100,000. In some other embodiments, the polyamic acid or polyimide of this invention has a $M_w$ of at least about 200,000. In some other embodiments, the polyamic acid or polyimide of this invention has a $M_w$ ranging from about 50,000 to 500,000, or higher.

The polyamic acid or polyimide of this invention generally contains an amic acid or imide repeat unit derived from at least one dianhydride and at least one diamine end capped with a monoaminoalkyl-maleimide of formula (II) as described herein. In some other embodiments, the polyamic acid or the polyimide of this invention contains an amic acid or imide repeat units derived from two or more anhydrides and two or more diamines as described herein, which is further end capped with the maleimide of formula (II) as described herein. All of such permutation and combinations are part of this invention.

Generally, equimolar ratios of dianhydrides and diamines are employed to form the polyamic acid or the polyimide. That is, one mole of dianhydride is condensed with one mole of diamine. When two or more dianhydrides or diamines are employed, any of the molar ratios of the respective two or more dianhydrides and diamines can be employed so as to tailor the properties of the resulting polyamic acid or the polyimide and depending upon the intended applications. In any event, the polyamic acid or the polyimide of this invention contains generally equal molar amounts of the total dianhydride and the total diamines when more than one dianhydride or more than one diamine is employed, and in combination with a monoaminoalkyl-maleimide of formula (II). That is, a polyamic or the polyimide of this invention is made by employing equimolar amounts of dianhydride and diamine, which includes desirable molar amounts of the end capped monoaminoalkyl-maleimide of formula (II).

Non-limiting examples of a polyamic acid or a polyimide made in accordance of this invention may be enumerated as follows:

A polyamic acid formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), 2-(4-aminophenyl)benzo[d]oxazol-5-amine (BZXPh-5) and 1-(2-aminoethyl)-3,4-dimethyl-1H-pyrrole-2,5-dione (DMMIEt-NH$_2$).

A polyimide formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), 2-(4-aminophenyl)benzo[d]oxazol-5-amine (BZXPh-5) and 1-(2-aminoethyl)-3,4-dimethyl-1H-pyrrole-2,5-dione (DMMIEt-NH$_2$).

A polyamic acid formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and 1-(2-aminoethyl)-3,4-dimethyl-1H-pyrrole-2,5-dione (DMMIEt-NH$_2$).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and 1-(2-aminoethyl)-3,4-dimethyl-1H-pyrrole-2,5-dione (DMMIEt-NH$_2$).

A polyamic acid formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 4,4'-methylenebis(2,6-dimethylaniline) (DO3) and 1-(2-aminoethyl)-3,4-dimethyl-H-pyrrole-2,5-dione (DMMIEt-NH$_2$).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 4,4'-methylenebis(2,6-dimethylaniline) (DO3) and 1-(2-aminoethyl)-3,4-dimethyl-H-pyrrole-2,5-dione (DMMIEt-NH$_2$).

A polyamic acid formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), bicyclo[2.2.1]heptane-2,5-diyldimethanamine (NBDA) and 1-(2-aminoethyl)-3,4-dimethyl-1H-pyrrole-2,5-dione (DMMIEt-NH$_2$).

A polyimide formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), bicyclo[2.2.1]heptane-2,5-diyldimethanamine (NBDA) and 1-(2-aminoethyl)-3,4-dimethyl-1H-pyrrole-2,5-dione (DMMIEt-NH$_2$).

A polyamic acid formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), a diamine of formula (III) (JD-230), 2-(4-aminophenyl)benzo[d]oxazol-5-amine (BZXPh-5) and 1-(2-aminoethyl)-3,4-dimethyl-1H-pyrrole-2,5-dione (DMMIEt-NH$_2$).

A polyimide formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), a diamine of formula (III) (JD-230), 2-(4-aminophenyl)benzo[d]oxazol-5-amine (BZXPh-5) and 1-(2-aminoethyl)-3,4-dimethyl-1H-pyrrole-2,5-dione (DMMIEt-NH$_2$).

A polyimide formed from 1H,3H-benzo[1,2-c:4,5-c']difuran-1,3,5,7-tetraone (PMDA), 4,4'-(1,3-phenylenebis(oxy))dianiline (APB), a diamine of formula (III) (JD-230) and 1-(2-aminoethyl)-3,4-dimethyl-1H-pyrrole-2,5-dione (DMMIEt-NH$_2$).

A polyamic acid formed from 1H,3H-benzo[1,2-c:4,5-c']difuran-1,3,5,7-tetraone (PMDA), 4,4'-(1,3-phenylenebis(oxy))dianiline (APB), a diamine of formula (III) (JD-230) and 1-(2-aminoethyl)-3,4-dimethyl-1H-pyrrole-2,5-dione (DMMIEt-NH$_2$).

A polyamic acid from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-(((perfluoropropane-2,2-diyl)bis(4,1-phenylene))bis(oxy))dianiline (HFBAPP), 2,2'-bis(trifluoromethyl)-[1,1'-biphenyl]-4,4'-diamine (PFMB) and 1-(2-aminoethyl)-3,4-dimethyl-1H-pyrrole-2,5-dione (DMMIEt-NH$_2$).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-(((perfluoropropane-2,2-diyl)bis(4,1-phenylene))bis(oxy))dianiline (HFBAPP), 2,2'-bis(trifluoromethyl)-[1,1'-biphenyl]-4,4'-diamine (PFMB) and 1-(2-aminoethyl)-3,4-dimethyl-1H-pyrrole-2,5-dione (DMMIEt-NH$_2$).

Advantageously, several of the polyamic acid or the polyimide of this invention are soluble in an organic solvent. Exemplary organic solvents, without any limitation, that can be employed to dissolve the polyamic acid or the polyimide of this invention are selected from the group consisting of N-methyl-2-pyrrolidone (NMP), γ-butyrolactone (GBL), N,N-dimethylacetamide (DMAc), propylene glycol monomethyl ether acetate (PGMEA), dimethyl sulfoxide (DMSO), cyclopentanone, cyclohexanone, 2-butanone and 2-heptanone and mixtures in any combination thereof. As noted, any of the aforementioned solvents can be used alone or in combination with one or more solvents.

Advantageously the polyimides of this invention exhibit very high thermo-mechanical properties. Specifically, it has now been found that the films formed from the polyimides of this invention exhibit excellent tensile properties as well as very high elongation to break (ETB). The films can be readily formed from any of the known solvent casting methods as well as melt extrusion methods. For example, the polyamic acid or polyimide of this invention can be coated onto a suitable substrate, such as for example, spin coating. The coated substrates are then baked to remove any residual solvents especially in the case of polyimide coated substrate. The polyamic acid coated substrates are further baked to form the polyimide at a suitable temperature. Such post apply baking (PAB) temperatures can range from about 100° C. to 150° C. for a sufficient length of time from about 2 minutes to 30 minutes. In some embodiments such PAB temperature is at about 110° C. for about 3 minutes. The polyamic acid films so formed are then cured at a temperature in the range of from about 280° C. to 350° C. to form the polyimide films for a sufficient length of time ranging from about 2 hours to 4 hours under inert atmosphere, such as for example, nitrogen atmosphere. In some embodiments such curing is carried out at 320° C. for about 3 hours. The cured films can readily be lifted out of the substrates for mechanical property testing. The tensile strength of the so formed films are generally in the range from about 100 MPa to about 250 MPa depending upon the type of dianhydrides and diamines employed to form the polyimide. In some embodiments the tensile strength is from about 150 MPa to about 200 MPa and in some other embodiments the tensile strength is from about 160 MPa to about 180 MPa. The ETB of the films are generally high as well. The ETB can range from about 30 percent to 100 percent or higher. In some embodiments the ETB ranges from about 40 percent to 90 percent, 50 percent to 80 percent, and so on.

In a further aspect of this invention there is further provided a composition comprising the polyamic acid or the polyimide of formulae (IA) or (IB) as described herein in combination with a photo radical generator. The compositions of this invention are photosensitive, and therefore, can be employed in a variety of optoelectronic application for forming a variety of polymeric layers, which may be patternable so as to find applications as dielectric materials.

The composition of this invention encompasses all of the polyamic acids and polyimides as described hereinabove derived from any of the dianhydrides, diamines, and the end capped maleimide as described hereinabove and hereafter, including the specific polyamic acids and the polyimides enumerated above and specifically exemplified below.

Any of the photo radical generators that would provide the intended benefit can be employed. That is, the radicals generated by the photo radical generator will cause the photo radical crosslinking of the polyamic acid and/or the polyimides of this invention with various ingredients used in the compositions of this invention so as to form polymeric layers. In some embodiments, the composition of this invention encompasses a photo radical generator selected from the group consisting of:

a compound of formula (IV):

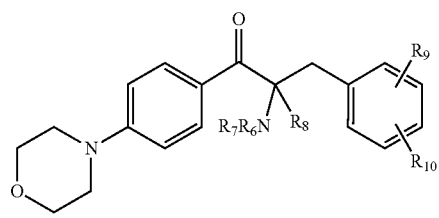

wherein $R_6$ and $R_7$ are the same or different and each independently of one another selected from the group consisting of hydrogen, linear or branched $(C_1-C_8)$alkyl and $(C_6-C_{10})$aryl, or $R_6$ and $R_7$ taken together with the nitrogen atom to which they are attached to form a 5 to 7 membered monocyclic ring or 6 to 12 membered bicyclic ring, said ring optionally containing one or more heteroatoms selected from O and N, and said ring optionally substituted with a group selected from the group consisting of linear or branched $(C_1-C_8)$alkyl, $(C_6-C_{10})$aryl, halogen, hydroxy, linear or branched $(C_1-C_8)$alkoxy and $(C_6-C_{10})$aryloxy; and $R_8$, $R_9$ and $R_{10}$ are the same or different and each independently of one another is selected from the group consisting of hydrogen, linear or branched $(C_1-C_{16})$alkyl, $(C_6-C_{10})$aryl, $(C_6-C_{10})$aryl$(C_1-C_3)$alkyl, hydroxy, halogen, linear or branched $(C_1-C_{12})$alkoxy and $(C_6-C_{10})$aryloxy; and a compound of formula (V):

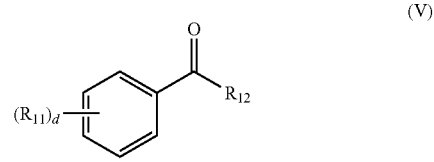

wherein d is an integer from 0 to 3, inclusive;

$R_{11}$ is selected from the group consisting of hydrogen, linear or branched $(C_1-C_{16})$alkyl, $(C_6-C_{10})$aryl, $(C_6-C_{10})$aryl$(C_1-C_3)$alkyl, hydroxy, halogen, linear or branched $(C_1-C_{12})$alkoxy and $(C_6-C_{10})$aryloxy;

$R_{12}$ is selected from the group consisting of linear or branched $(C_1-C_{16})$alkyl, $(C_3-C_8)$cycloalkyl, $(C_6-C_{10})$aryl, $(C_6-C_{10})$aryl$(C_1-C_3)$alkyl, $(C_6-C_{10})$aryl$(C_1-C_6)$alkylphosphinate, $(C_6-C_{10})$heterocycle$(C_1-C_3)$alkyl, a group of formula $C(O)-(OCH_2CH_2)_e-OC(O)C(O)(C_6-C_{10})$aryl, where e is an integer from 2 to 4, inclusive, $C(O)C(O)O(C_1-C_3)$alkyl and a group of formula (C):

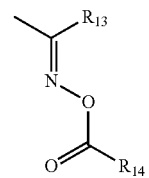

wherein $R_{13}$ is linear or branched $(C_1-C_{16})$alkyl; and $R_{14}$ is $(C_6-C_{10})$aryl;

and where each of said alkyl, cycloalkyl, aryl and heterocycle may additionally be substituted with one or more groups selected from the group consisting of hydroxy, linear or branched $(C_1-C_6)$alkyl, linear or branched $(C_1-C_6)$alkoxy and linear or branched thio$(C_1-C_6)$alkyl.

Non-limiting examples of the photo radical generator are enumerated as follows:

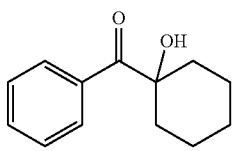

(1-hydroxycyclohexyl)(phenyl)methanone (commercially available as IRGACURE 184 from Ciba Specialty Chemicals)

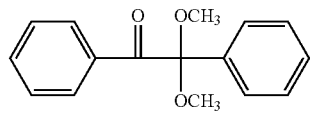

2,2-dimethoxy-1,2-diphenylethan-1-one (commercially available as IRGACURE 651 from Ciba Specialty Chemicals)

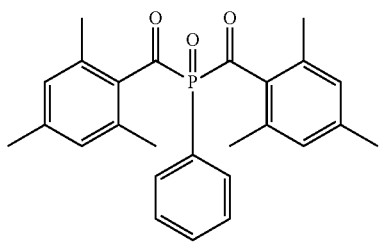

(phenylphosphoryl)bis(mesitylmethanone) (commercially available as IRGACURE 819 from Ciba Specialty Chemicals)

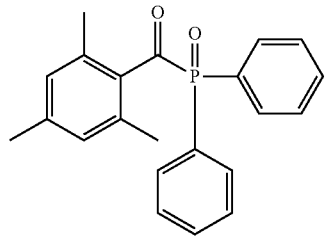

(diphenylphosphoryl)(mesityl)methanone (commercially available as DAROCUR TPO from Ciba Specialty Chemicals)

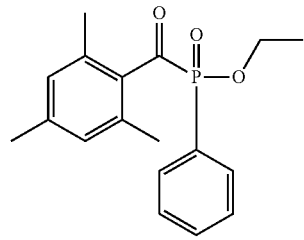

ethyl phenyl(2,4,6-trimethylbenzoyl)phosphinate (commercially available as OMNIRAD TPO L from IGM Resins)

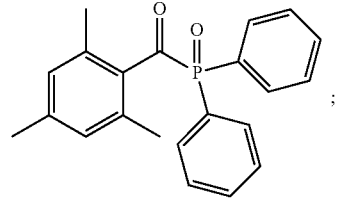

(diphenylphosphoryl)(mesityl)methanone

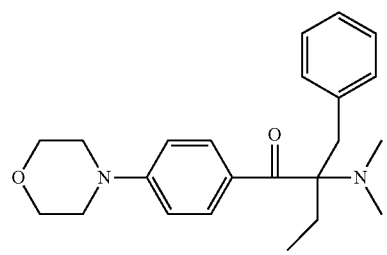

2-benzyl-2-(dimethylamino)-1-(4-morpholinophenyl)butan-1-one (commerically available as Irgacure 369 from Ciba Specialty Chemicals)

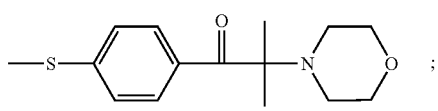

2-methyl-1-(4-methylthio)phenyl)-2-morpholinopropan-1-one (commerically available as Irgacure 907 from Ciba Specialty Chemicals)

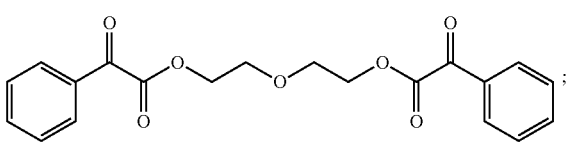

oxybis(ethane-2,1-diyl) bis(2-oxo-2-phenylacetate) (commerically available as Irgacure 754 from Ciba Specialty Chemicals)

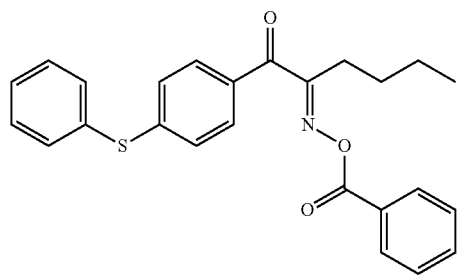

(E)-2-((benzoyloxy)imino)-1-(4-(phenylthio)phenyl)octan-1-one (commerically available as Irgacure OXE01 from Ciba Specialty Chemicals)

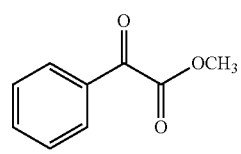

methyl 2-oxo-2-phenylacetate (commerically available as DAROCUR MBF from Ciba Specialty Chemicals)

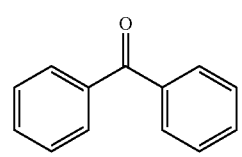

benzophenone (commerically available as DAROCUR BP from Ciba Specialty Chemicals)

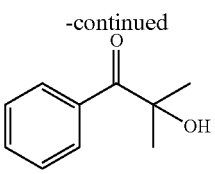

2-hydroxy-2-methyl-1-phenylpropan-1-
one (commerically available as DAROCUR 1173 from
Ciba Specialty Chemicals)

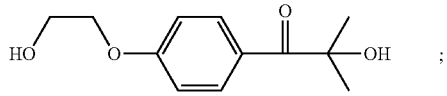

2-hydroxy-1-(4-(2-hydroxyethoxy)phenyl)-2-methylpropan-1-
one (commerically available as
Irgacure 2959 from Ciba Specialty Chemicals)

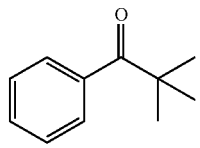

2,2-dimethyl-1-phenylpropan-1-one;

and a mixture in any combination thereof.

It should be noted that more than one photo radical generator can be employed so as to obtain beneficial effects. Accordingly, in some embodiments the composition of this invention contains two or more photo radical generators selected from the above list. Any of the suitable amounts of the photo radical generator can be employed in the composition of this invention which will bring about the intended effect. Generally, such amounts may vary from about 5 parts per hundred parts resin (pphr) to about 15 pphr or higher. In some embodiments the amount of photo radical generator employed is from about 8 pphr to about 12 pphr.

It has been further observed that employing one or more photosensitizers in the composition of this invention provides additional beneficial effects. Most notably, the photosensitizers facilitate photo radical generation from the photo radical generator at a particular wavelength of the radiated light. For this purpose, any suitable sensitizer compound can be employed in the compositions of the present invention. Such suitable sensitizer compounds include, photosensitizers, such as, anthracenes, phenanthrenes, chrysenes, benzpyrenes, fluoranthenes, rubrenes, pyrenes, xanthones, indanthrenes, and mixtures thereof. In some exemplary embodiments, suitable sensitizer components include mixtures thereof. Generally, as mentioned above, the photosensitizers absorb energy from the radiated light source and transfers that energy to the photo radical generator of formulae (IV) or (V) employed in the composition of this invention so as to generate the radicals to initiate the crosslinking. It has now been found that the photosensitizer as employed herein may itself act as a photo radical generator. Accordingly, in some embodiments, the composition of this invention contains only one or more photosensitizers, which not only activates the composition at certain wavelength but also generates photo radical triggering the crosslinking. In some other embodiments the composition of this invention contains one or more photo radical generators of formulae (IV) or (V) in combination with one or more photosensitizers of formula (VI) as described hereinbelow.

Accordingly, the composition of this invention contains one or more of a photosensitizer of the formula (VI):

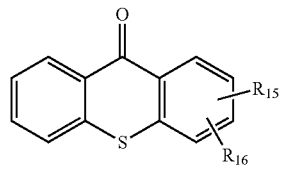

wherein $R_{15}$ and $R_{16}$ are the same or different and independently of each other selected from the group consisting of hydrogen, halogen, methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_{12})$alkoxy, $(C_3-C_{12})$Cycloalkoxy, $(C_6-C_{12})$bicycloalkoxy, $(C_7-C_{14})$tricycloalkoxy, $(C_6-C_{10})$aryloxy$(C_1-C_3)$alkyl and $(C_6-C_{10})$-aryloxy.

Non-limiting examples of suitable one or more photosensitizers may be selected from the group consisting of:

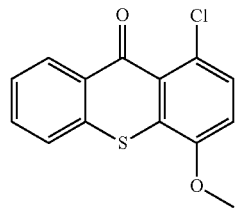

1-chloro-4-methoxy-9H-thioxanthen-9-one;

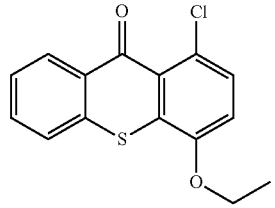

1-chloro-4-ethoxy-9H-thioxanthen-9-one;

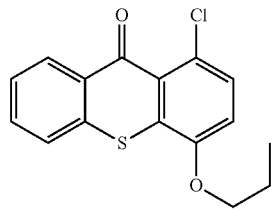

1-chloro-4-propoxy-9H-thioxanthen-9-one
(commerically available as CPTX from IGM resins);

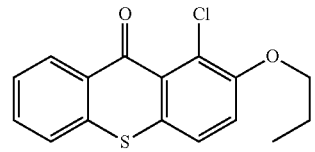

1-chloro-2-propoxy-9H-thioxanthen-9-one;

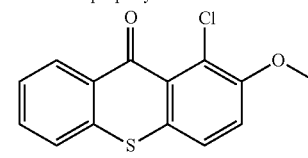

1-chloro-2-ethoxy-9H-thioxanthen-9-one;

-continued

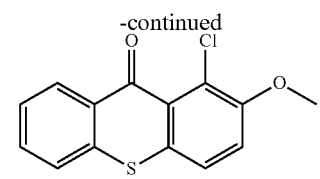
1-chloro-2-methoxy-9H-thioxanthen-9-one;

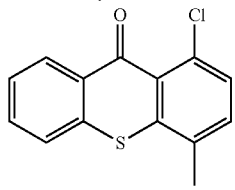
1-chloro-4-methyl-9H-thioxanthen-9-one;

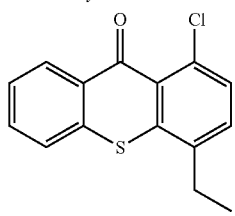
1-chloro-4-ethyl-9H-thioxanthen-9-one;

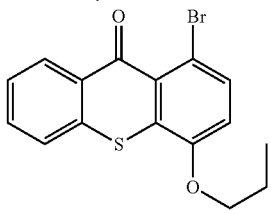
1-bromo-4-propoxy-9H-thioxanthen-9-one;

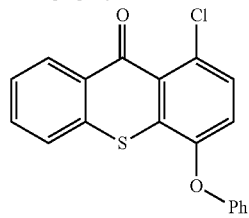
1-chloro-4-phenoxy-9H-thioxanthen-9-one;

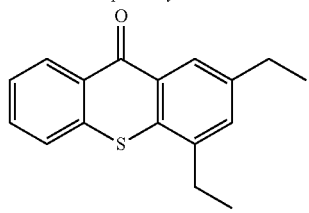
2,4-diethyl-9H-thioxanthen-9-one
(commercially available as OMNIRAD DETX from IGM resins)

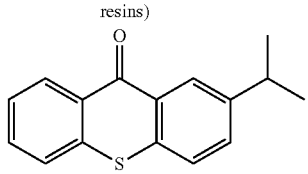
2,isopropyl-9H-thioxanthen-9-one
(commercially available as OMNIRAD ITX from IGM resins).

It should again be noted that any one of these compounds can be used as photosensitizers alone or as mixtures in any combination thereof, and only if needed depending upon the intended use and to obtain the desirable benefit. Again, any amount of one or more of aforementioned sensitizers can be used in the composition of this invention so as to bring about the desired results. Generally it has now been found that such amounts can range from 0.5 to 5 parts per hundred parts of the polymer resin (pphr). In some embodiments such amounts range from 1 to 3 pphr.

The compositions of the present invention also include one or more crosslinking agents that are advantageously capable of bonding with the end-capped maleimide group of the polyamic acid or polyimide or any other functional group available in the polymeric chain for further crosslinking when exposed to a suitable radiation. Such materials include, but are not limited to, crosslinking compounds that incorporate one or more of an oxazoline group such as 2-oxazoline-2-yl group, a methylol group such as a N-hydroxy methylaminocarbonyl group or an alkoxymethyl group such as a N-methoxy methylaminocarbonyl group, acrylate group, thiol or thioalkyl group, maleimide, and the like. Generally, the aforementioned bonding with the maleimide end group of the polyimide is a cross-linking reaction that is initiated by photo radical generated during the photo-irradiation at an appropriate temperature. Further, such crosslinking can be completed further by curing at an appropriate temperature post irradiation, generally at or above 150° C. for an appropriate amount of time. Such thermal curing can further be facilitated by thermal crosslinking agents such as for example, epoxy groups such as a glycidyl group, an epoxycyclohexyl group, an oxetane group, and the like. It should be noted however that it is surprising that such curing of the composition of this invention can be carried out at much lower temperature than conventionally used for polyimides known in the art, which is generally carried out at higher than 250° C. or even higher than 300° C.

Accordingly, in some embodiments of this invention, the photosensitive composition of this invention, without any limitation, contains one or more crosslinking agents selected from the following:
an epoxy acrylate;
a polyester acrylate;
a polyether acrylate;
an aliphatic urethane acrylate;
an aromatic urethane acrylate;
a multifunctional epoxy; and
a multifunctional mercapto($C_2$-$C_8$)alkanoate.

Exemplary crosslinking agents that may be employed in the composition of this invention without any limitation may be selected from the group consisting of:

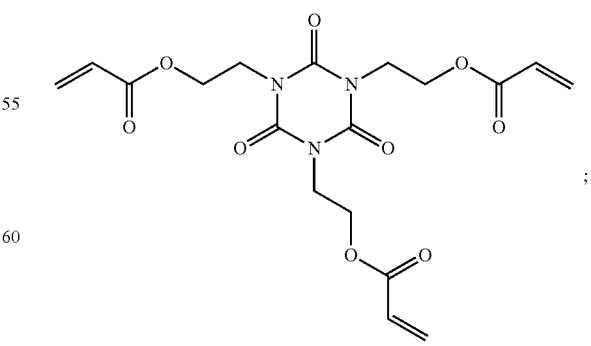
(2,4,6-trioxo-1,3,5-triazinane-1,3,5-triyl)tris(ethane-2,1-diyl) triacrylate (TAEICY)

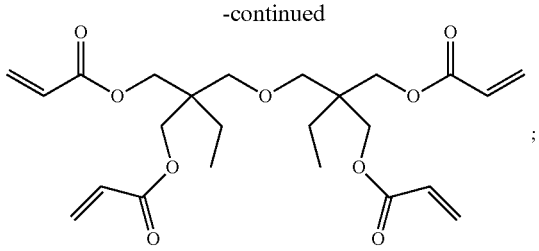

(oxybis(methylene))bis(2-ethylpropane-2,1,3-triyl) tetraacrylate (BTMPTA)

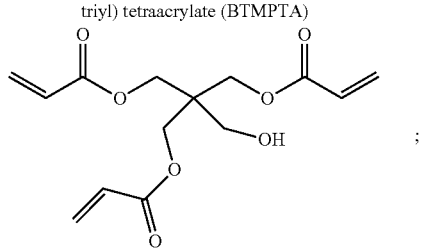

2-((acryloyloxy)methyl)-2-(hydroxymethyl)propane-1,3-diyl diacrylate (A-TMM)

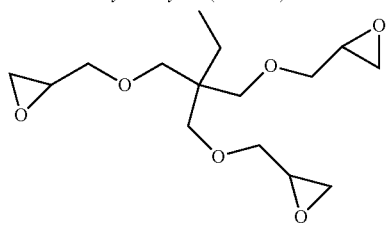

2,2'-(((2-ethyl-2-((oxiran-2-ylmethoxy)methyl)propane-1,3-diyl)bis(oxy))bis(methylene))bis(oxirane) (TMPTGE, from Nagase);

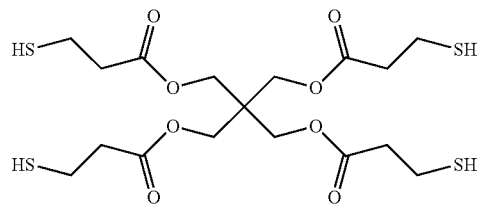

2,2-bis(((3-mercaptopropanoyl)oxy)methyl)propane-1,3-diyl bis(3-mercaptopropanoate) (PET3MP)

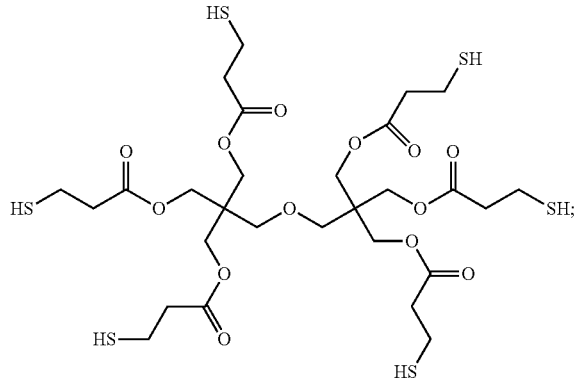

2,2,2',2'-tetrakis(3-mercaptopropanoyl)-3,3'(3-mercaptopropanoyl)-1,1'-dipropyl ether (DPEH3MP, from TCI)

The photosensitive composition of this invention further encompasses one or more compounds or additives having utility as, among other things, adhesion promoter, a surface leveling agent, antioxidants, a synergist, silane coupling agents, phenolic resins, flame retardants, plasticizers, curing accelerators, and the like. Examples of surface leveling agents include a variety of non-ionic, amphoteric and anionic surfactants available in the art, which provide, among other things, wetting, spreading and levelling properties. Exemplary surface leveling agents include without any limitation, non-ionic polymeric fluorochemical surfactant, such as for example, FC-4432 available from 3M Advanced Materials Division, a short chain perfluoro-based ethoxylated nonionic fluorosurfactant, such as for example, Chemguard S-550, CAPSTONE fluorosurfactants available as both nonionic and amphoteric forms from DuPont, Poly-Fox fluorosurfactants from OMNOVA Solutions, and the like. In addition, any of the known conventional surfactants may be used in combination with the above noted surfactants, such known non-ionic surfactants include for example, perfluoroalkyl polyoxyethylene ethanols, fluorinated alkyl esters, perfluoroalkylamine oxides and fluorinated organosiloxane compounds. Various other such commercially available surfactants include Florade FC-4430 from Sumitomo 3M Ltd., Surflon S-141 and S-145 from Asahi Glass Co., Ltd., Unidyne DS-401, DS-4031 and DS-451 from Daikin Industries Ltd., Megaface F-8151 from Dainippon Ink & Chemicals, Inc., and X-70-093 from Shin-Etsu Chemical Co., Ltd.

Non-limiting examples of such other compounds or additives are selected from the group consisting of the following, commercially available materials are indicated by such commercial names.

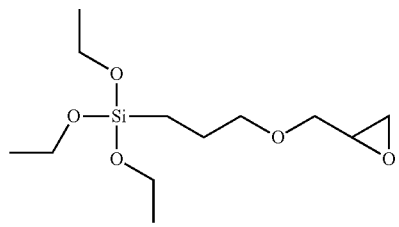

triethoxy(3-(oxiran-2-ylmethoxy)propyl)silane, also commonly known as 3-glycidoxypropyl triethoxysilane (3-GTS or (KBE-403 from Shin-Etsu Chemical Co., Ltd.));

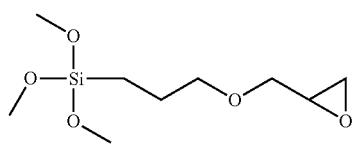

trimethoxy(3-(oxiran-2-ylmethoxy)propyl)silane, also commonly known as 3-glycidoxypropyl trimethoxysilane (KBM-403E from Shin-Etsu Chemical Co., Ltd.))
$C_6H_5(CH_3O)_3Si$
phenyltrimethoxysilane
$C_6H_5(C_2H_5O)_3Si$
phenyltriethoxysilane (KBE-103 commercially available from Gelest or Shin-Etsu Chemical Co., Ltd.)

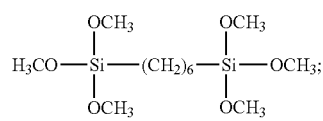

3,3,10,10-tetramethoxy-2,11-dioxa-3,10-disiladodecane (SIB-1832 from Gelest)

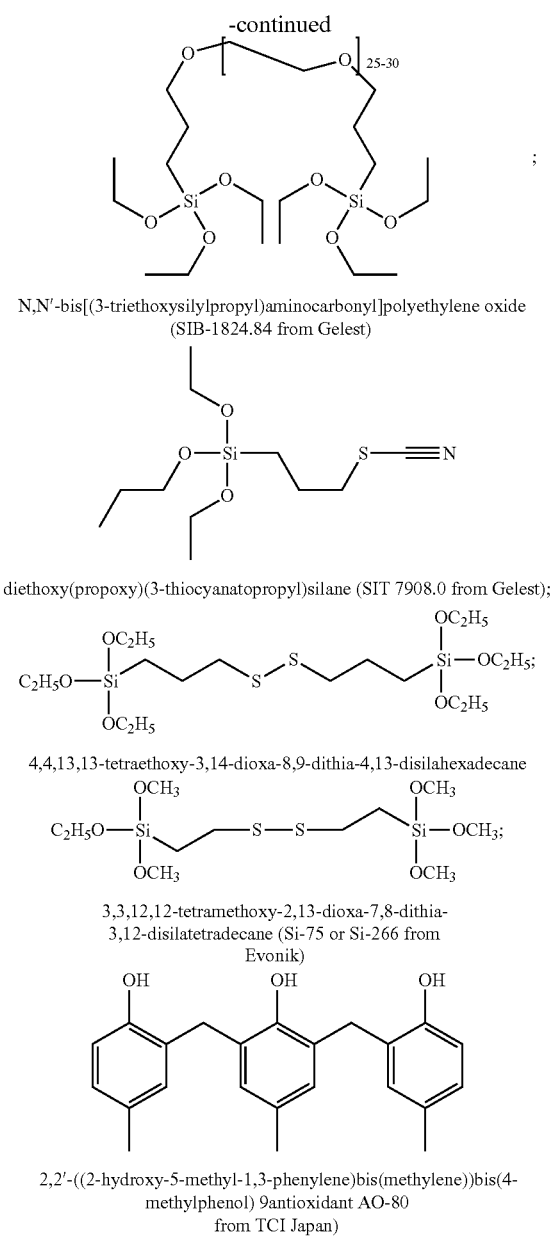

In general among other things, various compounds and additives as enumerated herein improve overall performance of the photosensitive composition of this invention thus providing well defined photo-patterned structures having a variety of utilities, including but not limited to chip-stack applications, redistribution layers and for forming CMOS image sensor dam structures. Advantageously, it has also been found that certain of the additives as described herein may feature more than one function. For example, some of the additives as enumerated hereinabove may not only exhibit certain photosensitization activity during exposure to radiation but may also facilitate as a cross linking agent as further described above. Therefore, additives as used herein do not limit the activity of such compounds to only one of such property but may also facilitate other functions of the photosensitive compositions of this invention.

The photosensitive composition embodiments, in accordance with the present invention, are first applied to a desired substrate to form a film. Such a substrate includes any appropriate substrate as is, or may be used for electrical, electronic or optoelectronic devices, for example, a semiconductor substrate, a ceramic substrate, a glass substrate. With regard to said application, any appropriate coating method can be employed, for example, spin coating, spraying, doctor blading, meniscus coating, ink jet coating and slot coating.

Next, the coated substrate is heated to facilitate the removal of residual casting solvent, for example to a temperature from 70° C. to 130° C. for from 1 to 30 minutes, although other appropriate temperatures and times can be used. After the heating, the film is generally imagewise exposed to an appropriate wavelength of actinic radiation, wavelength is generally selected based on the choice of the photo radical generator and/or photosensitizer incorporated into the polymer composition as described herein. However, generally such appropriate wavelength is from 200 to 700 nm. It will be understood that the phrase "imagewise exposure" means exposing through a masking element to provide for a resulting pattern of exposed and unexposed portion of the film, as further illustrated by specific examples hereinbelow.

After an imagewise exposure of the film formed from photosensitive composition in accordance with the present invention, a development process is employed. For the negative tone compositions as contemplated by the present invention, such development process removes only the unexposed portions of the film thus leaving a negative image of the masking layer in the film. A post exposure bake (PEB) is then employed prior to the aforementioned development process, generally at a temperature from 90° C. to 130° C. for from 1 to 10 minutes, although other appropriate temperatures and times can be used.

Suitable developers can include organic solvents such as propylene glycol methyl ether acetate (PGMEA), 2-heptanone, cyclohexanone, NMP, GBL, cyclopentanone, butyl acetate, and mixtures in any combination thereof, among others.

Thus some composition embodiments of the present invention provide self-imageable films that after imagewise exposure, the resulting image is developed using an organic solvent. After the image is developed, the substrate is rinsed to remove excess developer solution, typical rinse agents are water or appropriate alcohols and mixtures thereof. The excess developer can also be removed by blowing a stream of nitrogen on to the substrate. Other methods of removing excess developer include spinning the developed wafer at high spin speeds of about 1000-3000 rpm for 10-30 sec followed by applying a stream of nitrogen.

After the aforementioned rinsing, the substrate is dried and the imaged film finally cured. That is to say, the image is fixed. Where the remaining layer has already been exposed during the imagewise exposure, image fixing is generally accomplished by causing further reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure or a higher energy source and may be for a longer period of time although any other appropriate energy source can be employed. The heating is generally carried out at a desirable temperature, for example, from above 150° C. for a time of from 40 min to one or more hours. Where the remaining layer has been exposed during the imagewise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

The devices are produced by using embodiments of the composition of the present invention to form layers which are characterized as having high heat resistance, an appropriate water absorption rate, high transparency, and low permittivity. In addition, such layers generally have an advantageous thermo-mechanical properties. Most notably, improved tensile strength, improved elongation to break (ETB) and exhibit higher glass transition temperatures ($T_g$) when compared with conventional materials. For example, the tensile strength of the fully cured composition layer may be higher than 100 MPa and may be in the range of from about 120 MPa to 200 MPa or higher. The ETB of the cured composition layers can be higher than 30 percent and may range from about 50 percent to 100 percent or higher. The $T_g$ of the cured composition layer may be higher than 150° C. and can range from about 150° C. to 200° C. or higher. It should further be noted that the layers formed in this fashion from the composition of this invention also exhibit unusually high thermal decomposition temperature. Accordingly, the 5 percent weight loss temperature ($T_{d5}$) of the cured polymeric layers is generally higher than 300° C. and can range from 300° C. to 420° C. or higher, thus offering hitherto unattainable properties.

As previously mentioned, exemplary applications for embodiments of the photosensitive compositions in accordance with the present invention include die attach adhesive, wafer bonding adhesive, insulation films (interlayer dielectric layers), protecting films (passivation layers), mechanical buffer films (stress buffer layers) or flattening films for a variety of semiconductor devices, and printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a negative tone photosensitive polymer composition which exhibits enhanced characteristics with respect to one or more of mechanical properties (such as high tensile strength, elongation to break) and at least equivalent or better chemical resistance, as compared to alternate materials. In addition, such embodiments provide generally excellent electrical insulation, adhesion to the substrate, and the like. Thus semiconductor devices, device packages, and display devices are provided that incorporate embodiments in accordance with the present invention.

Advantageously, the photosensitive compositions of this invention can also be used to form adhesive layers for bonding the semiconductor chips to each other, such as in chip-stack applications. For example, a bonding layer used for such a purpose is composed of a cured product of the photosensitive adhesive composition of the present invention. It should be noted that although the adhesive layer is a single-layer structure, it can not only exhibit sufficient adhesiveness to the substrate but also it is expected to be free of significant stress resulting due to the curing step. Accordingly, it is now possible to avoid undesirably thick layer of film encompassing the chip as a laminate. Therefore, it should be noted that the laminates formed in accordance with the present invention are expected to be reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it is now possible to form a variety of electronic devices featuring hitherto unachievable level of miniaturization, thinning and light-weight, and the function of the semiconductor device is not easily damaged even if such devices are subject to rugged operations such as swinging or dropping.

A cured product of the photosensitive adhesive composition of the present invention, i.e., the adhesive layer or the film generally exhibits an indentation modulus of 2 to 4 GPa at 25° C. The cured product of the photosensitive adhesive composition of the present invention exhibits an indentation modulus of 70 to 120% of the indentation modulus of the non-cured product at 25° C., i.e., before such curing step. Further, the photosensitive adhesive composition of the present invention exhibits an excellent adhesiveness to a suitable substrate, such as for example a semiconductor chip, and adhesiveness of 20 to 200 Newton (N) at 25° C. can be achieved before curing and generally after etching and ashing process.

Thus, it is anticipated that the photosensitive adhesive composition of the present invention exhibits an indentation modulus at room temperature after curing which is relatively comparable to the indentation modulus of the uncured sample and not causing significant stress concentration between the semiconductor chips but contributing to forming of the adhesive layer with sufficient adhesiveness. Further, since the indentation modulus in a state before cured is within the predetermined range of indentation modulus after cured, and then, for example, it is not so possible that the photosensitive adhesive composition before cured is significantly deformed or flowed out, it is possible to increase the accuracy of alignment in laminating the semiconductor chips. Furthermore, since the change in indentation modulus before and after curing is relatively small, the shrinkage associated with photosensitivity can be reduced and then the stress at the interface between the semiconductor chips caused by shrinkage on curing can be reduced. This point also contributes to improvement of the reliability of the chip laminate.

The photosensitive adhesive composition of the present invention in a state before cured after etching process and ashing process is expected to exhibit sufficient stickiness with the semiconductor chip as required in die bonding. Therefore, the adhesive layer for bonding the semiconductor chips to each other securely fixes the semiconductor chips to each other and contributes to improvement of the reliability of the chip laminate.

As a result, it is possible to realize the adhesive layer having sufficiently both adhesiveness and stress relaxation by employing the photosensitive adhesive composition of the present invention. In other words, since the adhesive layer has both element protective function of buffer coat film (or, buffer coat function) and adhesive function of die bonding film (or, die bonding function) with a single layer, it is possible to form the chip laminate without decreasing the reliability and to thin the chip laminate as compared to the conventional one in two layers as well. Further, it is possible to reduce the volume of the mold portion and to shorten the bonding wire due to thinning of the chip laminate, thereby these factors contribute to light-weight and cost-savings.

Accordingly, in some of the embodiments, the indentation modulus of the cured product of the photosensitive adhesive composition of the present invention is generally 2 to 3 GPa at 25° C. as described above, and further, in some other embodiments it is about 2.2 to 3.2 GPa and in few other embodiments it is about 2.4 to 3.0 GPa. Incidentally, with the indentation modulus of the cured product being less than the above lower limit, the adhesiveness of the adhesive layer is reduced, thereby the interface of the layer with the semiconductor chip is peeled, and, when the filler is contained in the mold part, the filler may pass through the adhesive layer and adversely affect the semiconductor chip. Meanwhile, with the indentation modulus of the cured product being more than the above upper limit, the flexibility of the adhesive layer is reduced, thereby stress relaxation is lowered and it is impossible to mitigate, for example, residual stress generated in accordance with lamination of the semiconductor chips and local concentration of thermal stress due to thermal expansion difference between the semiconductor chips and the adhesive layer. Consequently, cracks are made in the semiconductor chips, or the semiconductor chip and the adhesive layer are peeled off from each other. Such problems can readily be overcome by the use of the photosensitive adhesive compositions of this invention.

Further, in some embodiments of this invention as described above, the electronic and/or the semiconductor device according to this invention encompass a laminated semiconductor element where said lamination consists of a photosensitive composition according to the present invention.

In some embodiments of this invention, the semiconductor device encompassing a redistribution layer (RDL) structure further incorporates a photosensitive composition according to this invention.

Further, in some embodiments of this invention as described above, the semiconductor device encompassing a chip stack structure further includes a photosensitive composition according to this invention.

In yet some other embodiments of this invention as described above, the semiconductor device encompassing a complementary metal oxide semiconductor (CMOS) image sensor dam structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a photosensitive composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photopattern; and curing the film by heating to a suitable temperature.

The coating of the substrate with photosensitive composition of this invention can be performed by any of the coating procedures as described herein and/or known to one skilled in the art, such as by spin coating.

In another aspect of this invention there is also provided a cured product comprising the composition of this invention.

This invention is further illustrated by the following examples which are provided for illustration purposes and in no way limit the scope of the present invention.

Examples (General)

The following abbreviations have been used hereinbefore and hereafter in describing some of the compounds, instruments and/or methods employed to illustrate certain of the embodiments of this invention:
6FDA—5,5'-(perfluoropropane-2,2-diyl)bis(isobenzofuran-1,3-dione); PMDA—1H,3H-benzo[1,2-c:4,5-c']difuran-1,3,5,7-tetraone; 6BF—4,4'-([1,1'-biphenyl]-4,4'-diylbis(oxy))bis(3-(trifluoromethyl)aniline); BZXPh-5—2-(4-aminophenyl)benzo[d]oxazol-5-amine; PFMB—2,2'-bis(trifluoromethyl)-[1,1'-biphenyl]-4,4'-diamine; DO3—4,4'-methylenebis(2,6-dimethylaniline); HFBAPP—4,4'-(((perfluoropropane-2,2-diyl)bis(4,1-phenylene))bis(oxy))dianiline; NBDA—bicyclo[2.2.1]heptane-2,5-diyldimethanamine; DMMA—dimethylmaleic anhydride; DMMIEt—$NH_2$-1-(2-aminoethyl)-3,4-dimethyl-1H-pyrrole-2,5-dione; IA—itaconic anhydride; IRGACURE 369—2-benzyl-2-(dimethylamino)-1-(4-morpholinophenyl)butan-1-one; CPTX—1-chloro-4-propoxy-9H-thioxanthen-9-one; BTMPTA—(oxybis(methylene))bis(2-ethylpropane-2,1,3-triyl) tetraacrylate; A-TMM—2-((acryloyloxy)methyl)-2-(hydroxymethyl)propane-1,3-diyl diacrylate; TAEICY—(2,4,6-trioxo-1,3,5-triazinane-1,3,5-triyl)tris(ethane-2,1-diyl) triacrylate; DPEH3MP—2,2,2',2'-tetrakis(3-mercaptopropanoyl)-3,3' (3-mercaptopropanoyl)-1,1'-dipropyl ether; KBM-403E—trimethoxy(3-(oxiran-2-ylmethoxy)propyl)silane; FC-4432—a non-ionic polymeric fluorochemical surfactant; NMP—N-methyl-2-pyrrolidone; GBL—γ-butyrolactone; DMAc—N,N-dimethylacetamide; DMSO—dimethyl sulfoxide; THF—tetrahydrofuran; GPC—gel permeation chromatography; $M_w$—weight average molecular weight; $M_n$—number average molecular weight; PDI—polydispersity index; $^1$H-NMR—proton nuclear magnetic resonance spectroscopy; FT-IR—Fourier transform infrared spectroscopy; ppm—parts per million; pphr—parts per hundred parts of resin.

Example 1

6FDA/6BF/BZXPh-5/DMMIEt-$NH_2$
(49.3/28.4/19.8/2.5)

6BF (19.5 g, 28.8 mmol), BZXPh-5 (4.51 g, 20 mmol) and DMMIEt-$NH_2$ (0.42 g, 2.5 mmol) were dissolved in NMP (166.6 g) and stirred at ambient temperature under a nitrogen atmosphere. To this solution was then added in small batches 6FDA (22.21 g, 50 mmol) while stirring. The reaction mixture was allowed to stir at ambient temperature for 20 hours during which time the solution became more viscous. The viscous solution was then diluted with NMP (53 g). A small portion of this solution was further diluted with DMAc for GPC analysis. GPC-DMAc $M_w$=130,650, $M_n$=68,650, PDI=1.9. A small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product, which was characterized by $^1$H NMR. $^1$H-NMR (500 MHz) spectra measured in deuterated DMSO showed a broad peak centered at about 13.5 ppm for COOH and 10.96 ppm, 10.94 ppm, 10.86 ppm, 10.83 ppm, 10.78 ppm and 10.73 ppm for —NH— groups of the polyamic acid in approximately 1:1 ratio. Multiple peaks in 6.7-8.7 ppm for the aromatic protons from 6FDA, BZXPh-5 and 6BF were also observed.

The polyamic acid solution thus obtained (160 g containing about 32 g polymer) was mixed with anhydrous pyridine (32 g), acetic anhydride (32 g) and cyclopentanone (50 g) and heated to 90° C. for 4 hours under nitrogen atmosphere while stirring. The reaction mixture was allowed to cool to ambient temperature and added to excess water/methanol (80/20) mixture (2 L) to isolate the polymer. The gummy product was washed with excess (1 L) heptane and dried in a vacuum oven at 90° C. for 24 hours to obtain a solid product (28 g, 88% isolated yield, GPC-DMAC $M_w$=154,150, $M_n$=69,500, PDI=2.22). $^1$H-NMR (500 MHz) spectra measured in deuterated DMSO did not show a broad peak centered at about 13.5 ppm for COOH or 10-11 ppm for —NH— groups indicating that the polyamic acid was quantitatively imidized. Multiple peaks in 6.7-8.7 ppm for the aromatic protons from 6FDA, BZXPh-5 and 6BF were also observed. FT-IR spectra showed peaks at 1378 cm$^{-1}$ and 722 cm$^{-1}$ characteristic of polyimides.

Example 2

6FDA/PMDA/6BF/PFMB/DMMIEt-NH$_2$
(24.7/24.7/29/19.1/2.5)

6BF (14.82 g, 29.4 mmol), PFMB (6.21 g, 19.4 mmol) and DMMIEt-NH$_2$ (0.42 g, 2.5 mmol) were dissolved in NMP (152 g) and stirred at ambient temperature under a nitrogen atmosphere. To this solution was then added a mixture of 6FDA (11.11 g, 25 mmol) and PMDA (5.45 g, 25 mmol) in small batches while stirring. The reaction mixture was stirred at ambient temperature for 20 hours during which time the solution became viscous. To this viscous solution was then added NMP (72 g). A small portion of this solution was further diluted with DMAc for GPC analysis. GPC-DMAc—$M_w$=131,500, $M_n$=72,550, PDI=1.81. A small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product, which was characterized by $^1$H NMR. $^1$H-NMR (500 MHz) spectra of this product measured in deuterated DMSO showed peaks at 10.97 ppm, 10.87 ppm, and 10.85 ppm for —NH— groups of the polyamic acid. Multiple peaks in 6.7-8.7 ppm for the aromatic protons from 6FDA, PMDA PFMB and 6BF were also observed.

The polyamic acid solution thus obtained (199.8 g containing about 30 g polymer) was mixed with anhydrous pyridine (30.7 g), acetic anhydride (31.3 g) and cyclopentanone (88 g) and the solution was heated to 95° C. for 6 hours under nitrogen atmosphere while stirring. The reaction mixture was allowed to cool to ambient temperature and THF was (100 g) added. This solution was then added to excess water/methanol (80/20) mixture (2.5 L) to isolate the polymer. The gummy product was washed with excess (2.5 L) water/methanol (80/20) mixture and dried in a vacuum oven at 90° C. for 30 hours to obtain a solid product (28.9 g, 96% isolated yield, GPC-DMAc $M_w$=130,350, $M_n$=63,500, PDI=2.05.

Example 3

6FDA/PMDA/6BF/PFMB/DMMIEt-NH$_2$
(24.7/24.7/29/19.1/2.5)

The procedure of Example 2 was substantially repeated in this Example 3 except for the scale of the imidization reaction by employing the amounts of the dianhydrides, diamines, DMMIEt-NH$_2$ and NMP as follows: 6BF (14.82 g, 29.4 mmol), PFMB (6.21 g, 19.4 mmol), 6FDA (11.11 g, mmol), PMDA (5.45 g, 25.0 mmol), NMP (152 g and 75 g) and DMMIEt-NH$_2$ (0.42 g, 2.5 mmol) to obtain a viscous polyamic acid solution in NMP. A small portion of this solution was further diluted with DMAc for GPC analysis. GPC-DMAc—$M_w$=157,350, $M_n$=84,500, PDI=1.86. A small sample of the solid polyamic acid was also isolated for $^1$H NMR (500 MHz) analysis. $^1$H NMR (500 MHz) spectra measured in deuterated DMSO showed a broad peak centered at about 13.5 ppm for COOH and 10.99 ppm, 10.88 ppm, and 10.85 ppm for —NH— groups of the polyamic acid in approximately 1:1 ratio. Multiple peaks in 6.7-8.7 ppm for the aromatic protons from 6FDA, PMDA PFMB and 6BF were also observed.

The polyamic acid (86 g containing about 12 g polymer) thus obtained was then converted to polyimide substantially following the procedure as set forth in Example 2 using anhydrous pyridine (12 g), acetic anhydride (12 g) and cyclopentanone (86 g) at 90° C. for 6 hours to obtain a solid product (11.3 g, 94% isolated yield, GPC-DMAc $M_w$=171,150, $M_n$=78,150, PDI=2.19). $^1$H-NMR (500 MHz) spectra measured in deuterated DMSO did not show a broad peak centered at about 13.5 ppm for COOH or 10-11 ppm for —NH— groups indicating that the polyamic acid was quantitatively imidized. Multiple peaks in 6.7-8.7 ppm for the aromatic protons from 6FDA, PMDA, PFMB and 6BF were observed. FT-IR spectra showed peaks at 1367 cm$^{-1}$ and 723 cm$^{-1}$ characteristic of polyimides.

Example 4

6FDA/PMDA/6BF/PFMB/DMMIEt-NH$_2$
(24.7/24.7/29.0/19.1/2.5)

6BF (17.78 g, 35.3 mmol), PFMB (7.45 g, 23.3 mmol) and DMMIEt-NH$_2$ (0.51 g, 3 mmol) were dissolved in NMP (182.4 g) and stirred at ambient temperature under a nitrogen atmosphere. A mixture of 6FDA (13.33 g, 30 mmol) and PMDA (6.54 g, 30 mmol) was then added in small batches to the above solution while stirring. The reaction mixture was stirred at ambient temperature for 20 hours during which time the solution turned viscous. An additional amount of NMP (62 g) was added to this viscous solution. A small portion of this solution was further diluted with DMAc for GPC analysis. GPC-DMAc—$M_w$=121,150, $M_n$=69,500, PDI=1.74. A small sample of this polymer solution was also added to excess water/acetone (80/20) mixture to isolate the polymer. The gummy product was washed with excess water/acetone (80/20) mixture and dried in a vacuum oven at 50-60° C. for 24 hours to obtain a solid product, which was characterized by $^1$H NMR. $^1$H-NMR (500 MHz) spectra measured in deuterated DMSO showed a broad peak centered at about 13.5 ppm for COOH and 10.97 ppm, 10.87 ppm, and 10.85 ppm for —NH— groups of the polyamic acid in approximately 1:1 ratio. Multiple peaks were observed at 6.7-8.7 ppm for the aromatic protons from 6FDA, PMDA PFMB and 6BF.

The polyamic acid solution thus obtained (194.8 g containing about 31 g polymer) was then mixed with anhydrous pyridine (31.1 g), acetic anhydride (32.1 g) and cyclopentanone (60 g) and the solution was heated to 95° C. for 6 hours under nitrogen atmosphere while stirring. The reaction mixture was allowed to cool to ambient temperature and THF (51 g) was added. This solution was then added to excess water/methanol (80/20) mixture (2.5 L) to isolate the polymer. The gummy product was washed with excess (2.5 L) water/methanol (80/20) mixture and dried in a vacuum oven at 70° C. for 24 hours to obtain a solid product (31.5 g). The product was characterized by GPC and $^1$H NMR. GPC-DMAc $M_w$=90,350, $M_n$=48,000, PDI=1.88. $^1$H-NMR (500 MHz) spectra measured in deuterated DMSO showed only traces of a broad peak centered at around 13.5 ppm for COOH and 10-11 ppm for —NH— groups indicating that the polyamic acid was quantitatively imidized. Multiple peaks were observed at 6.7-8.7 ppm for the aromatic protons from 6FDA, PMDA PFMB and 6BF. FT-IR spectra showed peaks at 1375 cm$^{-1}$ and 723 cm$^{-1}$ characteristic of polyimides.

Example 5

6FDA/PMDA/6BF/PFMB/DMMIEt-NH$_2$
(24.7/24.7/29/19.1/2.5)

6BF (14.82 g, 29.4 mmol), PFMB (6.2 g, 19.4 mmol) and DMMIEt-NH$_2$ (0.42 g, 2.5 mmol) were dissolved in NMP (152 g) and stirred at ambient temperature under a nitrogen atmosphere. A mixture of 6FDA (11.11 g, 25 mmol) and PMDA (5.45 g, 25 mmol) was added in small batches to this solution while stirring. The reaction mixture was stirred at ambient temperature for 20 hours during which time the solution turned viscous. An additional amount of NMP (127 g) was added to the viscous solution. A small portion of this solution was further diluted with DMAc for GPC analysis. GPC-DMAc—$M_w$=114,100, $M_n$=69,050, PDI=1.65. A small sample of the solid polyamic acid was also isolated for $^1$H NMR (500 MHz) analysis. $^1$H NMR spectra measured in deuterated DMSO showed peaks at 10.97 ppm, 10.87 ppm, 10.85 ppm and 10.82 ppm for —NH— groups of the polyamic acid. Multiple peaks were observed at 6.7-8.7 ppm for the aromatic protons from 6FDA, PMDA PFMB and 6BF.

The polyamic acid solution (214.1 g containing about 26 g polymer) thus obtained was mixed with anhydrous pyridine (25.4 g), acetic anhydride (25.5 g) and cyclopentanone (78 g) and the solution was heated to 95° C. for 6 hours under nitrogen atmosphere while stirring. The reaction mixture was allowed to cool to ambient temperature and THF (100 g) was added. This solution was then added to excess water/methanol (80/20) mixture (2.5 L) to isolate the polymer. The gummy product was washed with excess (2 L) water/methanol (80/20) mixture and dried in a vacuum oven at 70° C. for 24 hours to obtain a solid product (25 g, 96% yield) and was characterized by GPC and $^1$H NMR. GPC-DMAc—$M_w$=169,000, $M_n$=81,700, PDI=2.07. $^1$H-NMR (500 MHz) spectra measured in deuterated DMSO showed only traces of a broad peak centered at around 13.5 ppm for COOH and 10-11 ppm for —NH— groups indicating that the polyamic acid was quantitatively imidized. Multiple peaks were observed at 6.7-8.7 ppm for the aromatic protons from 6FDA, PMDA PFMB and 6BF.

Example 6

6FDA/PMDA/6BF/PFMB/DMMIEt-NH$_2$
(24.6/24.6/28.6/18.8/3.4)

6BF (14.69 g, 29.1 mmol), PFMB (6.13 g, 19.1 mmol) and DMMIEt-NH$_2$ (0.59 g, 3.5 mmol) were dissolved in NMP (151.9 g) and stirred at ambient temperature under a nitrogen atmosphere. A mixture of 6FDA (11.11 g, 25 mmol) and PMDA (5.45 g, 25 mmol) was added in small batches to this solution while stirring. The reaction mixture was stirred at ambient temperature for 20 hours during which time the solution turned viscous. An additional amount of NMP (69 g) was added to this viscous solution. A small portion of this solution was further diluted with DMAc for GPC analysis. GPC-DMAc—$M_w$=111,042, $M_n$=64,700, PDI=1.72. A small sample of the solid polyamic acid was also isolated for $^1$H NMR (500 MHz) analysis. $^1$H NMR (500 MHz) spectra measured in deuterated DMSO showed peaks at 10.87 ppm, 10.87 ppm, and 10.85 ppm for —NH— groups of the polyamic acid. Multiple peaks were observed at 6.7-8.7 ppm for the aromatic protons from 6FDA, PMDA PFMB and 6BF.

The polyamic acid solution (200 g containing about 30 g polymer) thus obtained was mixed with anhydrous pyridine (32.9 g), acetic anhydride (30.3 g) and cyclopentanone (33 g) and the solution was heated to 95° C. for 6 hours under nitrogen atmosphere while stirring. The reaction mixture was allowed to cool to ambient temperature and THF (25 g) was added. This solution was then added to water/methanol (80/20) mixture (2.5 L) to isolate the polymer. The gummy product was washed with (2 L) water/methanol (80/20) mixture and dried in a vacuum oven at 80-90° C. for 24 hours to obtain a solid product (28 g, 93% yield) and characterized by GPC and $^1$H NMR. GPC-DMAc—$M_w$=94,200, $M_n$=47,000, PDI=2.01. $^1$H-NMR (500 MHz) spectra measured in deuterated DMSO showed only traces of peaks at 10.5-11.5 ppm for —NH— groups indicating that the polyamic acid was quantitatively imidized. Multiple peaks were observed at 6.7-8.7 ppm for the aromatic protons from 6FDA, PMDA PFMB and 6BF. FT-IR spectra showed peaks at 1373 cm$^{-1}$ and 723 cm$^{-1}$ characteristic of polyimides.

Example 7

6FDA/PMDA/6BF/PFMB/DMMIEt-NH$_2$
(24.7/24.7/14.2/33.9/2.5)

6BF (7.25 g, 14.4 mmol), PFMB (11 g, 34.4 mmol) and DMMIEt-NH$_2$ (0.42 g, 2.5 mmol) were dissolved in NMP (141 g) and stirred at ambient temperature under a nitrogen atmosphere. A mixture of 6FDA (11.11 g, 25 mmol) and PMDA (5.45 g, 25 mmol) was added in small batches to this solution while stirring. The reaction mixture was stirred at ambient temperature for 20 hours during which time the solution turned viscous. An additional amount of NMP (120 g) was added to the viscous solution. A small portion of this solution was further diluted with DMAc for GPC analysis. GPC-DMAc—$M_w$=84,300, $M_n$=53,650, PDI=1.57. A small sample of the polymer solution was added to excess water/ acetone (80/20) mixture to isolate the polymer. The gummy product was washed with excess water/acetone (80/20) mixture and dried in a vacuum oven at 50-60° C. for 24 hours to obtain a solid product.

The polyamic acid solution (234 g containing about 28 g polymer) thus obtained above was mixed with anhydrous pyridine (28.8 g), acetic anhydride (29.5 g) and cyclopentanone (60 g) and the solution heated to 95° C. for 6 hours under nitrogen atmosphere while stirring. The reaction mixture was allowed to cool to ambient temperature and THF (100 g) was added. This solution was then added to water/methanol (80/20) mixture (2.5 L) to isolate the polymer. The gummy product was washed with (2 L) water/methanol (80/20) mixture and dried in a vacuum oven at 70° C. for 24 hours to obtain a solid product (27.5 g, 98% yield), and was characterized by GPC and $^1$H NMR. GPC-DMAc—$M_w$=180,750, $M_n$=74,700, PDI=2.42. $^1$H-NMR (500 MHz) spectra measured in deuterated DMSO showed only traces of a broad peak centered at about 13.5 ppm for COOH and 10-11 ppm for —NH— groups indicating that the polyamic acid was quantitatively imidized. Multiple peaks were observed at 6.7-8.7 ppm for the aromatic protons from 6FDA, PMDA PFMB and 6BF. FT-IR spectra showed peaks at 1372 cm$^{-1}$ and 723 cm$^{-1}$ characteristic of polyimides.

Example 8

6FDA/PMDA/6BF/DO3/DMMIEt-NH$_2$
(24.7/24.7/29.6/19.1/2.5)

6BF (14.82 g, 29.4 mmol), DO3 (4.99 g, 19.4 mmol) and DMMIEt-NH$_2$ (0.42 g, 2.5 mmol) were dissolved in NMP (147.1 g) and stirred at ambient temperature under a nitrogen atmosphere. A mixture of 6FDA (11.11 g, 25 mmol) and PMDA (5.45 g, 25 mmol) was added in small batches to this solution while stirring. The reaction mixture was then stirred at ambient temperature for 20 hours during which time the solution turned viscous. An additional amount of NMP (78 g) was added to this viscous solution. A small portion of this solution was further diluted with DMAc for GPC analysis. GPC-DMAc—$M_w$=96,500, $M_n$=58,300, PDI=1.65. A small sample of the solid polyamic acid was also isolated for $^1$H NMR (500 MHz) analysis. $^1$H-NMR (500 MHz) spectra measured in deuterated DMSO showed a broad peak centered at about 13.5 ppm for COOH and 10.87 ppm, 10.84 ppm, 9.90 ppm and 9.88 ppm for —NH— groups of the polyamic acid in approximately 1:1 ratio. Multiple peaks were observed at 6.7-8.7 ppm for the aromatic protons from 6FDA, PMDA, DO3 and 6BF.

The polyamic acid solution (200 g containing about 28 g polymer) thus obtained above was then mixed with anhydrous pyridine (28.1 g), acetic anhydride (29.2 g) and cyclopentanone (81 g) and the solution was heated to 90° C. for 5 hours under nitrogen atmosphere while stirring. The reaction mixture was allowed to cool to ambient temperature and THF (100 g) was added. This solution was then added to water/acetone (80/20) mixture (2.5 L) to isolate the polymer. The gummy product was washed with (2.5 L) water/acetone (80/20) mixture and dried in a vacuum oven at 80-90° C. for 24 hours to obtain a solid product (26.8 g, 96% yield) and was characterized by GPC and $^1$H NMR. GPC-DMAc—$M_w$=106,550, $M_n$=55,750, PDI=1.95. $^1$H-NMR (500 MHz) spectra measured in deuterated DMSO showed only traces of a broad peak centered at around 13.5 ppm for COOH and 10-11 ppm for —NH— groups indicating that the polyamic acid was quantitatively imidized. Multiple peaks were observed at 6.7-8.7 ppm for the aromatic protons from 6FDA, PMDA DO3 and 6BF.

Example 9

(6FDA/6BF/NBDA/DMMIEt-NH$_2$)
(47.6/7.1/35.7/9.6)

6BF (17.03 g, 33.8 mmol), NBDA (1.04 g, 6.75 mmol) and DMMIEt-NH$_2$ (1.514 g, 9 mmol) were dissolved in NMP (158.3 g) and stirred at ambient temperature under a nitrogen atmosphere. To this solution was added 6FDA (19.99 g, 45.08 mmol) in small batches while stirring. The reaction mixture was stirred at ambient temperature for 20 hours during which time the solution turned viscous. A small portion of the solution was diluted with sufficient quantities of DMAc for GPC analysis. GPC-DMAc—$M_w$=41,800, $M_n$=22,900, PDI=1.83. A sample of the polymer solution was also added to excess heptane to isolate the polymer for $^1$H NMR analysis. The gummy product was washed with excess heptane and dried in a vacuum oven at 70° C. for 24 hours to obtain a solid product. $^1$H-NMR (500 MHz) spectra measured in deuterated DMSO showed a broad peak centered at about 13 ppm for COOH and 10.8 ppm for —NH— groups of the polyamic acid. Multiple peaks were also observed at 6.7-8.7 ppm for the aromatic protons from 6FDA and 6BF.

Example 10

6FDA/PMDA/HFBAPP/PFMB/DMMIEt-NH$_2$
(24.7/24.7/29.6/19.1/2.5)

HFBAPP (7.23 g, 14 mmol), PFMB (3.34 g, 10.4 mmol) and DMMIEt-NH$_2$ (0.21 g, 1.25 mmol) were dissolved in NMP (76.2 g) and stirred at ambient temperature under a nitrogen atmosphere. A mixture of 6FDA (5.55 g, 12.5 mmol) and PMDA (2.73 g, 12.5 mmol) was added in small batches to this solution while stirring. The reaction mixture was stirred at ambient temperature for 20 hours during which time the solution turned viscous. An additional amount of NMP (40 g) was added to the viscous solution. A small portion of this solution was further diluted in DMAc for GPC analysis. GPC-DMAc—$M_w$=104,550, $M_n$=48,600, PDI=2.15.

The polyamic acid solution (115 g containing about 16 g polymer) thus obtained above was mixed with anhydrous pyridine (16 g), acetic anhydride (16 g) and cyclopentanone (75 g) and the solution was heated to 90° C. for 6 hours under nitrogen atmosphere while stirring. The polymer became insoluble as the imidization progressed.

Example 11

6FDA/PMDA/BZXPh-5/6BF/DMMIEt-NH$_2$
(29.6/19.8/29.0/19.1/2.5)

6BF (10.37 g, 20.6 mmol), BZXPh-5 (3.06 g, 13.6 mmol) and DMMIEt-NH$_2$ (0.294 g, 1.75 mmol) were dissolved in NMP (104.4 g) and stirred at ambient temperature under a nitrogen atmosphere. A mixture of 6FDA (9.33 g, 21 mmol) and PMDA (3.05 g, 14 mmol) was added in small batches to this solution while stirring. The reaction mixture was stirred at ambient temperature for 20 hours during which time the solution turned viscous. An additional amount of NMP (25 g) was added to this viscous solution. A small portion of this solution was further diluted in DMAc for GPC analysis. GPC-DMAc—$M_w$=124,300, $M_n$=71,650, PDI=1.74.

The polyamic acid solution (103 g containing about 18 g polymer) thus obtained above was mixed with anhydrous pyridine (17.4 g), acetic anhydride (17.4 g) and cyclopentanone (108 g) and the solution was heated to 95° C. for 2 hours under nitrogen atmosphere while stirring. The polymer became insoluble as the imidization progressed.

Example 11A

6FDA/PMDA/DO3/PFMB/DMMIEt-NH$_2$
(34.6/14.9/29.0/19.1/2.5)

DO3 (11.21 g, 44.1 mmol), PFMB (9.31 g, 29.1 mmol) and DMMIEt-NH$_2$ (0.63 g, 3.75 mmol) were dissolved in NMP (170 g) and stirred at ambient temperature under a nitrogen atmosphere. To this solution was then added a mixture of 6FDA (9.99 g, 22.5 mmol) and PMDA (11.45 g, 52.5 mmol) in small batches while stirring. The reaction mixture was stirred at ambient temperature for 20 hours during which time the solution became viscous. To this viscous solution was then added NMP (117 g). A small portion of this solution was further diluted with DMAc for GPC analysis. GPC-DMAc—$M_w$=83,550, $M_n$=40,650, PDI=2.06.

The polyamic acid solution thus obtained (330 g containing about 42 g polymer) was mixed with anhydrous pyridine (10 g), acetic anhydride (20 g) and cyclopentanone (75 g) and the solution was heated to 90° C. for 6 hours under nitrogen atmosphere while stirring. The reaction mixture was allowed to cool to ambient temperature and THF was (150 g) added. This solution was then added to excess water/methanol (80/20) mixture (2.5 L) to isolate the polymer. The gummy product was washed with excess (2.5 L) water/methanol (80/20) mixture and dried in a vacuum oven at 110-120° C. for 30 hours to obtain a solid product (39.2 g, 92% isolated yield, GPC-DMAc $M_w$=109,950, $M_n$=57,850, PDI=1.87.

Example 12

Tensile Property Measurements

Each of the polyamic acids formed in Examples 3, 9, 10, and the polyamic acids formed in Comparative Examples 1-3 were filtered separately using 0.45 μm or 1 μm pore polytetrafluoroethylene (PTFE) disc filters. Each of these polymer solutions were then spin coated on to a series of 4" Bare Si wafers by spinning at 300 rpm for 30 seconds followed by post apply bake (PAB) at 110° C. for 3 minutes to generate films in 15-25 μm range. The films were then cured at 320° C. for 3 hours in an oven under nitrogen atmosphere. The cured films were subsequently diced to 6 mm wide film strips and lifted out of the Bare Si wafers by immersing in a dilute (1 wt. %) hydrogen fluoride (HF) solution in water. Tensile properties of each of these film samples were measured using Instron and are summarized in Table 1. The data presented in Table 1 includes both the average tensile strength and the maximum observed tensile strength for each of these samples as well as the average elongation to break (ETB) and the maximum observed ETB. It is quite evident from this data that the incorporation of a DMMI end group in the polymer in accordance with this invention substantially increases the tensile strength and ETB of films over a wide range of polymer compositions.

TABLE 1

| Polymer Example No. | End group | Tensile Strength MPa (SD) | Tensile Strength Max, MPa | ETB % (SD) | ETB Max, % |
|---|---|---|---|---|---|
| Comp. Ex. 1 | IA | 127 (21) | 151 | 35 (20) | 59 |
| Example 3 | DMMI | 133 (21) | 169 | 46 (13) | 69 |
| Comp. Ex. 2 | IA | 119 (21) | 149 | 46 (37) | 90 |
| Example 9 | DMMI | 129 (20) | 165 | 68 (18) | 100 |
| Comp. Ex. 3 | IA | 112 (10) | 125 | 53 (24) | 72 |
| Example 10 | DMMI | 147 (31) | 191 | 55 (19) | 80 |

SD—standard deviation

Example 13

Photosensitive Compositions—Thermo-Mechanical Properties

Isolated polyimide polymers from Example 1 (6FDA/6BF/BZXPh-5/DMMIEt-NH$_2$, 49.3/28.4/19.8/2.5), Comparative Example 4 (6FDA/6BF/BZXPh-5/IA, 48.1/29.6/19.8/2.5) and Comparative Example 5 (6FDA/6BF/BZXPh-5, 50/30/20) were dissolved in a mixture of GBL/cyclopentanone (3:1) to form respectively 18 wt. %, 17 wt. % and 15 wt. % solutions. To each of these solutions were added IRGACURE 369 as a photo radical generator (10 pphr), CPTX as the photo-sensitizer (2 pphr), BTMPTA as the acrylate cross linker (50 pphr), DPEH3MP as the thiol cross linker (50 pphr), KBM-403E as the adhesion promoter (5 pphr), FC-4432 as the surface leveling agent (0.3 pphr) and GBL (100 pphr) as extra solvent.

The compositions as formed above were filtered using 0.45 μm or 1 μm pore polytetrafluoroethylene (PTFE) disc filters. These formulations were spin coated on 4" Bare Si wafers by spinning at 325-1700 rpm for 30 seconds followed by post apply bake (PAB) at 110° C. for 3 minutes to generate films of thickness in 8-14 μm range. The films were then exposed using a broad band Hg-vapor light source (at 365 nm using a band pass filter) at an exposure doses of 2000 mJ/cm$^2$ followed by a post exposure bake (PEB) step at 110° C. for 2 minutes. The exposed films were cured at 170° C. for 4 hours in an oven under nitrogen atmosphere. The cured films were subsequently diced to 6 mm wide film strips and lifted out of the Bare Si wafers by immersing in a dilute (1 wt. %) hydrogen fluoride (HF) solution in water. Tensile properties were measured using Instron and the results are summarized in Table 2. The comparison of tensile strength and ETB of these compositions demonstrates that incorporation of a DMMI end group in accordance with the practice of this invention substantially increases tensile strength and ETB of the films.

TABLE 2

| Polymer Example No. | End Group | Tensile Strength MPa (SD) | Tensile Strength Max, MPa | ETB % (SD) | ETB Max, % |
|---|---|---|---|---|---|
| Comp. Ex. 5 | None | 81 (8) | 89 | 30 (19) | 48 |
| Comp. Ex. 4 | IA | 74 (6) | 82 | 24 (16) | 43 |
| Example 1 | DMMI | 90 (13) | 109 | 48 (13) | 64 |

SD—standard deviation

Example 14

Photosensitive Compositions—Thermo-Mechanical Properties

The procedures of Example 13 were substantially repeated in this Example 14 except that TAEICY as the acrylic cross linker (50 pphr) was used instead of BTMPTA in each of the compositions in this Example 13.

The compositions as formed above were filtered using 0.45 μm or 1 μm pore polytetrafluoroethylene (PTFE) disc filters. These formulations were spin coated on 4" Bare Si wafers by spinning at 500-800 rpm for 30 seconds followed by post apply bake (PAB) at 110° C. for 3 minutes to generate films of thickness in 9-15 μm range. The films were then exposed using a broad band Hg-vapor light source (at 365 nm using a band pass filter) at an exposure doses of 1500 mJ/cm$^2$ followed by a post exposure bake (PEB) step at 110° C. for 2 minutes. The exposed films were cured at 170° C. for 4 hours in an oven under nitrogen atmosphere. The cured films were subsequently diced to 6 mm wide film strips and lifted out of the Bare Si wafers by immersing in a dilute (1 wt. %) hydrogen fluoride (HF) solution in water. Tensile properties were measured using Instron and the results are summarized in Table 3. It should be noted again that the comparison of tensile strength and ETB of these compositions clearly shows that incorporation of a DMMI end group substantially increases tensile strength and ETB of the polymer films formed in accordance with the practice of this invention.

TABLE 3

| Polymer Example No. | End group | Tensile Strength, MPa (SD) | Tensile Strength (max), MPa | ETB % (SD) | ETB Max, % | $T_g$, ° C. |
|---|---|---|---|---|---|---|
| Comp. Ex. 5 | None | 117 (1) | 119 | 11 (4) | 16 | 197 |
| Comp. Ex. 4 | IA | 105 (7) | 114 | 5 (1) | 6 | 198 |
| Example 1 | DMMI | 127 (13) | 145 | 53 (26) | 79 | 189 |

SD—standard deviation

The following Example 15 demonstrates that photoimaging compositions can also be made by using polyamic acids in accordance with the practice of this invention.

Example 15

Photo Imaging Studies Using Polyamic Acid

Isolated polyamic acid (33 g) from Example 9 (6FDA/6BF/NBDA/DMMIEt-NH$_2$, 47.6/7.1/35.7/9.6) containing about 7 g NMP was dissolved in PGMEA (75 g) to obtain 29 wt. % solution. To this solution was added Irgacure-369 as the photo radical generator (10 pphr), BTMPTA as the acrylate cross linker (50 pphr), KBM-403E as the adhesion promoter (5 pphr), CPTX as the photo-sensitizer (2 pphr) and FC-4432 as the surface leveling agent (0.3 pphr), which was designated as Example 15-1. Another batch of this composition was made additionally containing DPEH3MP as the thiol cross linker (50 pphr), which was designated as Example 15-2.

The compositions so formed in Examples 15-1 and 15-2 were filtered using 0.20 μm pore polytetrafluoroethylene (PTFE) disc filter. These compositions were then spin coated on 4" SiO$_2$ wafers by spinning at 900 rpm for 30 seconds followed by post apply bake (PAB) at 110° C. for 3 minutes to generate films of about 5-9 μm thickness. The films were then exposed using a broad band Hg-vapor light source (at 365 nm using a band pass filter) at an exposure dose ranging from 0-2000 mJ/cm$^2$ through a mask to generate lines, trenches, pillars and holes. The exposed film was post exposure baked (PEB) at 110° C. for 2 minutes and developed with cyclopentanone immersion for 40-120 seconds to reveal the patterns corresponding to the mask. The film thicknesses of the exposed areas were measured at various exposure doses to determine the film thickness loss (bright field loss, BFL). Table 4 summarizes the imaging results. It is evident from this data that use of DPEH3MP as a thiol cross linker improves the photo imaging properties such as lowering the exposure dose and BFL perhaps due to the fact that DPEH3MP may facilitate thiol-ene cross linking reaction, among other factors.

TABLE 4

| Example No. | DPEH3MP present | FT (μm) | Dose (mJ/cm$^2$) | BFL (%) |
|---|---|---|---|---|
| Example 15-1 | No | 6.11 | 1200 | 61 |
| Example 15-2 | Yes | 8.23 | 1288 | 28 |
| Example 15-2 | Yes | 8.23 | 1020 | 32 |

FT = film thickness

Example 16

Photo Imaging Studies of Polyimide Polymer

Isolated polyimide polymer as set forth in Example 3 (6FDA/PMDA/6BF/PFMB/DMMIEtNH$_2$, 24.7/24.7/29.0/19.1/2.5) was dissolved in a mixture of GBL/cyclopentanone (3:1) to prepare 19 wt. % solution. To this solution was added Irgacure-369 as a photo radical generator (10 pphr), CPTX as the photo-sensitizer (2 pphr), BTMPTA as an acrylate cross linker (30 pphr), TAEICY as an acrylate cross linker (30 pphr), KBM-403E as the adhesion promoter (5 pphr), dicumyl peroxide as a thermal radical initiator (DCP, 4 pphr) and FC-4432 as the surface leveling agent (0.3 pphr) to form a composition in accordance with this invention.

Figure 2:
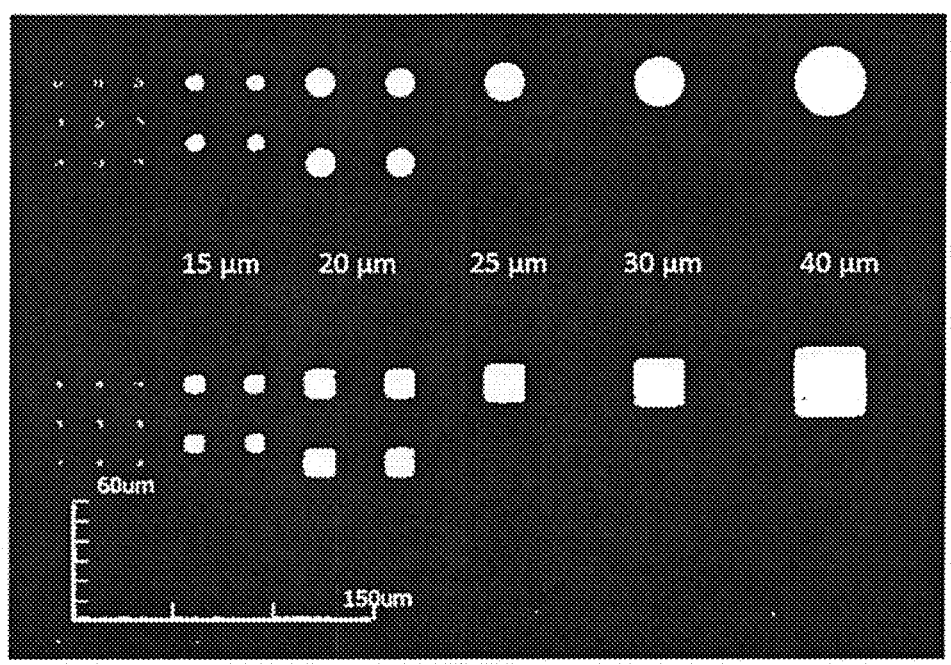
FIG. 2 shows laser micrograph images formed from a composition embodiment of this invention.
Figure 3:
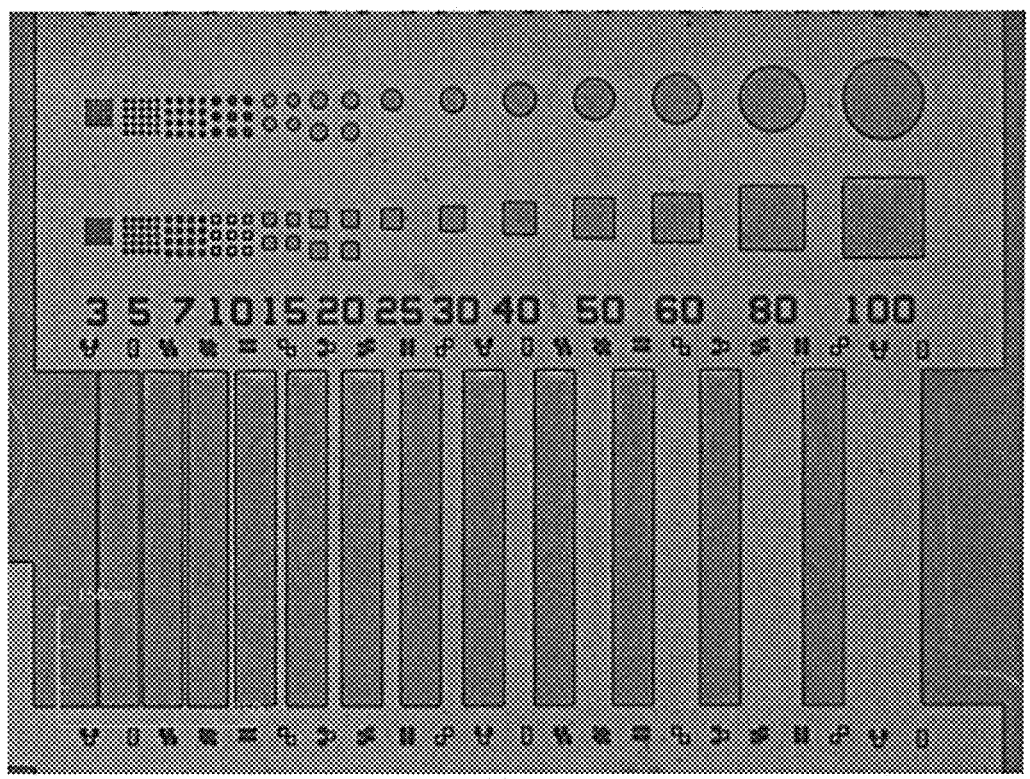
Figure 4:
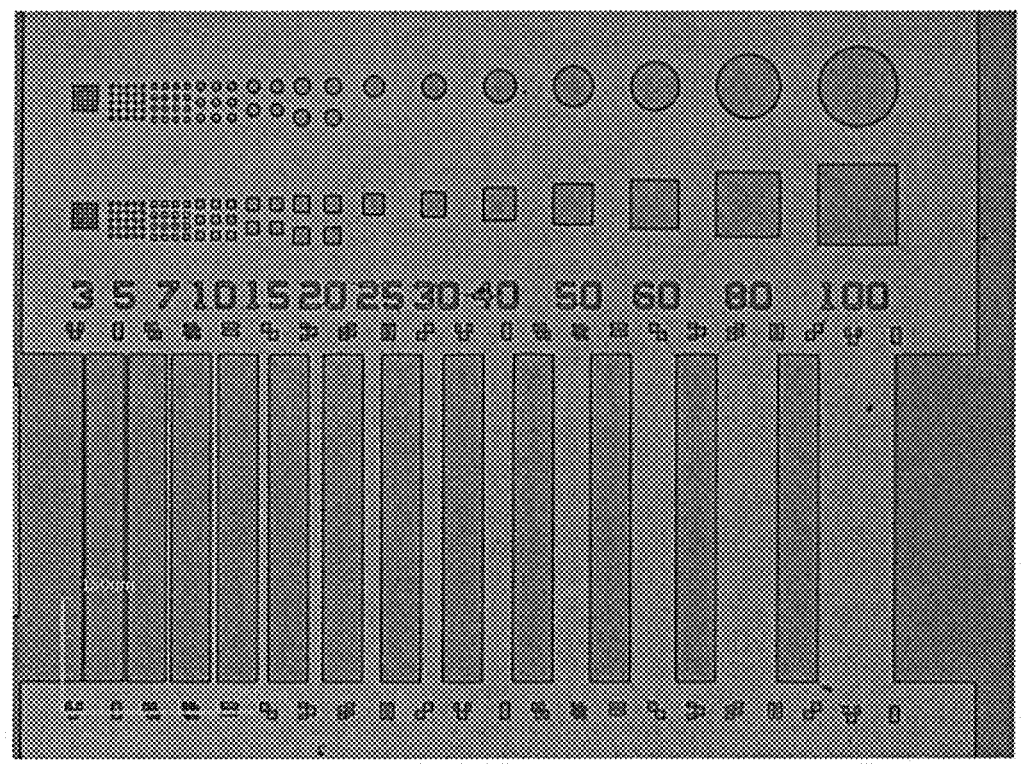

The composition thus formed was filtered using 0.2 μm pore polytetrafluoroethylene (PTFE) disc filter. This composition was spin coated on 4" SiO$_2$ wafer by spinning at 500 rpm for 30 seconds followed by post apply bake (PAB) at 105° C. for 3 minutes to generate a film of 4 m thickness. The film was then exposed using a broad band Hg-vapor light source (at 365 nm using a band pass filter) at an exposure dose of 1020 mJ/cm$^2$ through a mask to generate negative tone images of lines, trenches, pillars and holes. The exposed film was post exposure baked (PEB) at 105° C. for 2 minutes and developed with cyclopentanone immersion for 75 seconds to reveal the patterns corresponding to the mask. The film thickness of the exposed area was 4.3 μm indicating slight swelling of the film (6%) during the photo imaging process. The imaged areas have resolutions of 5 μm (lines), 7 μm (pillars) and 15 μm (holes). FIG. 1 shows an optical microscope generated top-down optical micrograph of pillars and lines at about 3-7 μm resolution. FIG. 2 shows a top down laser micrograph images of contact holes at about 15 μm resolution.

The thermo-mechanical properties of the films formed from the above composition was measured as follows. The composition was spin coated on 5" SiO$_2$ wafers by spinning at 310 rpm for 30 seconds followed by post apply bake (PAB) at 110° C. for 3 minutes to generate a film of about 9.6 μm thickness. The film was then exposed using a broad band Hg-vapor light source (at 365 nm using a band pass filter) at an exposure doses of 1200 mJ/cm$^2$ in combination with a mask to generate 4.5 mm and 6.5 mm wide strips after development with cyclopentanone for 75 seconds. The exposed film was post exposure baked (PEB) at 110° C. for 2 minutes before development. The exposed and developed film was cured at 170° C. for 4 hours in an oven under nitrogen atmosphere. The cured film strips were subsequently lifted out of the SiO$_2$ wafer by immersing in a dilute (1 wt. %) hydrogen fluoride (HF) solution in water. Tensile and thermal properties were measured using Instron, TMA and TGA. Table 5 summarizes the results obtained from these thermo-mechanical analysis of the cured films.

TABLE 5

| | |
|---|---|
| Tensile Strength, MPa (SD) | 122 (11) |
| Tensile Strength (max), MPa | 136 |
| ETB, % (SD) | 35 (21) |
| ETB (max), % | 53 |
| Young's Modulus, GPa | 3.4 (0.1) |
| CTE, ppm/K (50-100° C. range) | 52 |
| $T_g$, ° C. | 169 |
| $T_{d5}$, ° C. | 410 |

SD—standard deviation; CTE—coefficient of thermal expansion.

The following Comparative Examples 1-4 utilize itaconic anhydride (IA) as the reactive end group in place of DMMIEt-NH$_2$. These Comparative Examples 1 to 4 further demonstrate that the polyimide containing IA end group provide lower benefits than that provided by the instant invention as shown by the comparative properties demonstrated in Examples 12 to 14 above.

Comparative Example 1

6FDA/PMDA/6BF/PFMB/IA
(24.1/24.1/29.6//19.7/2.5)

6BF (15.13 g, 30 mmol) and PFMB (6.41 g, 20 mmol) were dissolved in NMP (150.7 g) and stirred at ambient temperature under a nitrogen atmosphere. A mixture of 6FDA (10.83 g, 24.4 mmol), PMDA (5.317 g, 24.4 mmol) and IA (0.28 g, 2.5 mmol) was added in small batches to the above solution while stirring. The reaction mixture was stirred at ambient temperature for 20 hours during which time the solution turned viscous. An additional amount of NMP (33 g) was added to this viscous solution. A small portion of this solution was then diluted with DMAc for GPC analysis. GPC-DMAc—M$_w$=107,050, M$_n$=60,700, PDI=1.76. A small sample of the polymer solution was also added to excess water/acetone (80/20) mixture to isolate the polymer for $^1$H NMR analysis. The gummy product was washed with excess water/acetone (80/20) mixture and dried in a vacuum oven at 50-60° C. for 24 hours to obtain a solid product. $^1$H-NMR (500 MHz) spectra measured in deuterated DMSO showed a broad peak centered at about 13.5 ppm for COOH and 10.99 ppm, 10.88 ppm, and 10.86 ppm for —NH— groups of the polyamic acid in approximately 1:1 ratio. Multiple peaks were observed at 6.7-8.7 ppm for the aromatic protons from 6FDA, PMDA PFMB and 6BF.

The polyamic acid solution (65 g containing about 11 g polymer) thus obtained was then mixed with anhydrous pyridine (11 g), acetic anhydride (11 g) and cyclopentanone (62 g) and the solution was heated to 90° C. for 6 hours under nitrogen atmosphere while stirring. The reaction mixture was allowed to cool to ambient temperature and THF (25 g) was added. This solution was added to excess water/methanol (80/20) mixture (1.7 L) to isolate the polymer. The gummy product was washed with excess (1.2 L) water/methanol (80/20) mixture and dried in a vacuum oven at 70° C. for 24 hours to obtain a solid product (10.4 g, 95% isolated yield), which was characterized by GPC and $^1$H NMR. GPC-DMAc—M$_w$=143,800, M$_n$=66,150, PDI=2.17.

$^1$H-NMR (500 MHz) spectra measured in deuterated DMSO did not show a broad peak centered at about 13.5 ppm for COOH or 10-11 ppm for —NH— groups indicating that the polyamic acid was quantitatively imidized. Multiple peaks were observed at 6.7-8.7 ppm for the aromatic protons from 6FDA, PMDA PFMB and 6BF. FT-IR spectra showed peaks at 1374 cm$^{-1}$ and 723 cm$^{-1}$ characteristic of polyimides.

Comparative Example 2

6FDA/PMDA/HFBAPP/PFMB/IA
(24.1/24.1/26.6/19.7/2.5)

HFBAPP (7.78 g, 15 mmol) and PFMB (3.2 g, 10 mmol) were dissolved in NMP (76.2 g) and stirred at ambient temperature under a nitrogen atmosphere. A mixture of 6FDA (5.41 g, 12.2 mmol), PMDA (2.66 g, 12.2 mmol) and IA (0.140 g, 1.25 mmol) was added in small batches to the above solution while stirring. The reaction mixture was stirred at ambient temperature for 20 hours during which time the solution turned viscous. An additional amount of NMP (21 g) was added to the viscous solution. A small portion of this solution was then diluted with DMAc for GPC analysis. GPC-DMAC—M$_w$=74,650, M$_n$=38,400, PDI=2.05.

The polyamic acid solution (100 g containing about 16 g polymer) thus obtained above was mixed with anhydrous pyridine (16 g), acetic anhydride (16 g) and cyclopentanone (75 g) and the solution was heated to 90° C. for 6 hours under nitrogen atmosphere while stirring. The polymer became insoluble as the imidization progressed.

Comparative Example 3

6FDA/PMDA/6BF/BZXPh-5/IA
(29/19.1/29.6/19.8/2.5)

6BF (10.6 g, 21 mmol) and BZXPh-5 (3.15 g, 14 mmol) were dissolved in NMP (103.4 g) and stirred at ambient temperature under a nitrogen atmosphere. A mixture of 6FDA (9.14 g, 20.6 mmol), PMDA (2.96 g, 13.6 mmol) and IA (0.196 g, 1.75 mmol) was added in small batches to the above solution while stirring. The reaction mixture was stirred at ambient temperature for 20 hours during which time the solution turned viscous. An additional amount of NMP (25 g) was added to this viscous solution. A small portion of this solution was then diluted with DMAc for GPC analysis. GPC-DMAc—M$_w$=103,700, M$_n$=54,200, PDI=1.91.

The polyamic acid solution (118 g containing about 20 g polymer) thus obtained above was mixed with anhydrous pyridine (20 g), acetic anhydride (20 g) (and cyclopentanone (88 g) and the solution heated to 95° C. for 2 hours under nitrogen atmosphere while stirring. The polymer became insoluble as the imidization progressed.

Comparative Example 4

6FDA/6BF/BZXPh-5/IA (48.1/29.6/19.8/2.5)

A mixture of 6BF (15.13 g, 30 mmol), BZXPh-5 (4.5 g, 20 mmol) and IA (0.28 g, 2.5 mmol) were dissolved in NMP (165.1 g) and stirred at ambient temperature under a nitrogen atmosphere. To this solution was then added 6FDA (21.63 g, 48.7 mmol) in small batches while stirring that generated about 5° C. exotherm. The reaction mixture was stirred at ambient temperature for 20 hours. A small portion of this solution was diluted with DMAc for GPC analysis. GPC-DMAc—$M_w$=99,600, $M_n$=47,850, PDI=2.08.

The polyamic acid solution (127 g containing about 25 g polymer) thus obtained above was mixed with anhydrous pyridine (25 g), acetic anhydride (25 g) and cyclopentanone (100 g) and the solution heated to 90° C. for 4 hours under nitrogen atmosphere while stirring. The reaction mixture was allowed to cool to ambient temperature and added to excess water/methanol (80/20) mixture (1.5 L) to isolate the polymer. The gummy product was washed with excess (1 L) heptanes and dried in a vacuum oven at 80° C. for 24 hours to obtain a solid product (23 g, 92% isolated yield), which was characterized by GPC, $^1$H NMR and FT-IR. GPC-DMAc—$M_w$=99,900, $M_n$=44,400, PDI=2.25. $^1$H-NMR (500 MHz) spectra measured in deuterated DMSO showed only traces of a peak centered at about 10.4 ppm indicating that the polyamic acid was quantitatively imidized. Multiple peaks were observed at 6.7-8.6 ppm for the aromatic protons. FT-IR spectra showed peaks at 1379 cm$^{-1}$ and 722 cm$^{-1}$ characteristic of polyimides.

The following Comparative Example 5 demonstrates that the polyimide containing no reactive end group will not provide the benefits provided by the instant invention as shown by the comparative properties shown in Example 12 above.

Comparative Example 5

6FDA/6BF/BZXPh-5 (50/30/20)

A mixture of 6BF (15.13 g, 30 mmol) and BZXPh-5 (4.51 g, 20 mmol) was dissolved in NMP (167.4 g) and stirred at ambient temperature under a nitrogen atmosphere. To this solution was then added 6FDA (22.12 g, 50 mmol) in small batches while stirring that generated about 5° C. exotherm. The reaction mixture was stirred at ambient temperature for 20 hours. A small portion of this solution was diluted with DMAc for GPC analysis. GPC-DMAc—$M_w$=174,300, $M_n$=85,600, PDI=2.04. A small sample of the polymer solution was also added to excess water/acetone (80/20) mixture to isolate the polymer for $^1$H NMR analysis. The gummy product was washed with excess heptane and dried in a vacuum oven at 80-90° C. for 24 hours to obtain a solid product. $^1$H-NMR (500 MHz) spectra measured in deuterated DMSO showed a broad peak centered at about 13.5 ppm for COOH and 10.96 ppm, 10.94 ppm, 10.86 ppm and 10.84 ppm for —NH— groups of the polyamic acid in approximately 1:1 ratio. Multiple peaks were observed at 6.7-8.4 ppm for the aromatic protons from 6FDA, BZXPh-5 and 6BF.

The polyamic acid solution (100 g containing 20 g polymer) thus obtained above was mixed with anhydrous pyridine (25 g) and acetic anhydride (25 g) and the solution heated to 90° C. for 4 hours under nitrogen atmosphere while stirring. The reaction mixture was allowed to cool to ambient temperature and was added to excess water/acetone (80/20) mixture (1.5 L) to isolate the polymer. The gummy product was washed with excess (1 L) heptanes and dried in a vacuum oven at 80-90° C. for 24 hours to obtain a solid product (18.2 g, 92% isolated yield), which was characterized by GPC, $^1$H NMR and FT-IR. GPC-DMAc—$M_w$=178,800, $M_n$=80,050, PDI=2.23. $^1$H-NMR (500 MHz) spectra measured in deuterated DMSO showed only traces of a broad peak centered at about 13 ppm for COOH and 10-11 ppm for —NH— groups of the polyamic acid indicating that the polyamic acid was quantitatively imidized. Multiple peaks were observed at 6.7-8.6 ppm for the aromatic protons of 6FDA, 6BF and BZXPh-5. FT-IR spectra showed peaks at 1378 cm$^{-1}$ and 722 cm$^{-1}$ characteristic of polyimides.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. An end capped polyamic acid of the formula (IA) or an end capped polyimide of the formula (IB):

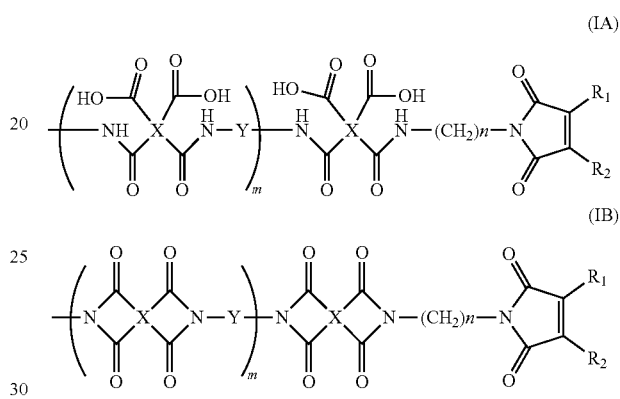

wherein:

m is an integer of at least 50;

n is an integer from 1 to 12, inclusive;

X is one or more distinct tetravalent organic group;

Y is one or more distinct divalent organic group, wherein Y is derived from one or more diamines selected from the group consisting of:

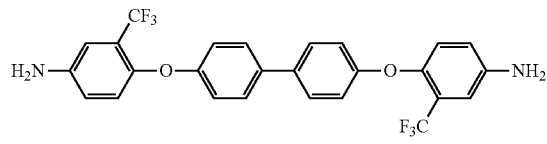

4,4'-([1,1'-biphenyl]-4,4'-diylbis(oxy))bis(3-(trifluoromethyl)aniline)(6BF);

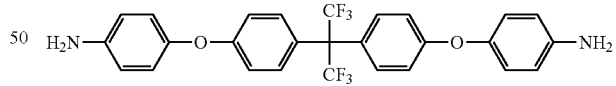

4,4'-(((perfluoropropane-2,2-diyl)bis(4,1-phenylene))bis(oxy))dianiline(HFBAPP);

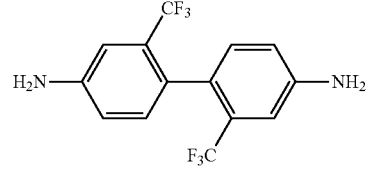

2,2'-bis(trifluoromethyl)-[1,1'-biphenyl]-4,4'-diamine (PFMB);

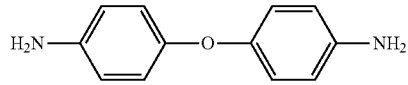

4,4'-oxydianiline (4,4'-ODA);

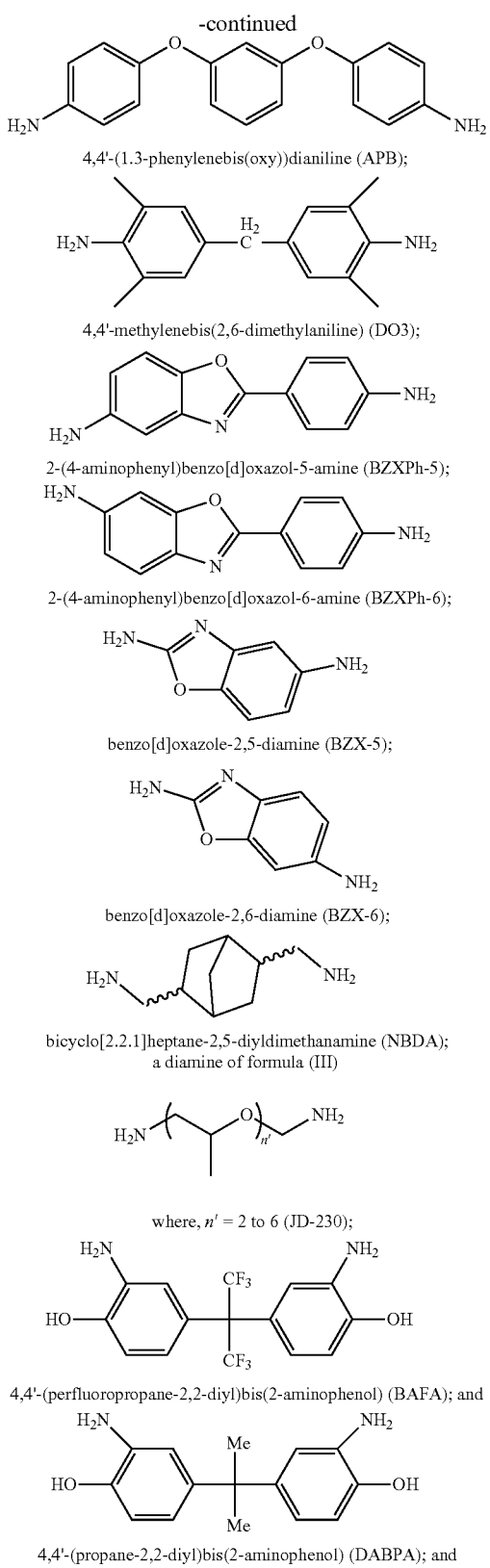

4,4'-(1.3-phenylenebis(oxy))dianiline (APB);

4,4'-methylenebis(2,6-dimethylaniline) (DO3);

2-(4-aminophenyl)benzo[d]oxazol-5-amine (BZXPh-5);

2-(4-aminophenyl)benzo[d]oxazol-6-amine (BZXPh-6);

benzo[d]oxazole-2,5-diamine (BZX-5);

benzo[d]oxazole-2,6-diamine (BZX-6);

bicyclo[2.2.1]heptane-2,5-diyldimethanamine (NBDA);
a diamine of formula (III)

(III)

where, $n' = 2$ to 6 (JD-230);

4,4'-(perfluoropropane-2,2-diyl)bis(2-aminophenol) (BAFA); and 4,4'-(propane-2,2-diyl)bis(2-aminophenol) (DABPA); and $R_1$ and $R_2$ are the same or different and each independently of one another selected from the group consisting of hydrogen, linear or branched $(C_1-C_{16})$alkyl, hydroxy$(C_1-C_{12})$alkyl, perfluoro$(C_1-C_{12})$alkyl, $(C_6-C_{10})$aryl and $(C_6-C_{10})$aryl$(C_1-C_3)$alkyl provided that both $R_1$ and $R_2$ are not hydrogen; or $R_1$ and $R_2$ taken together with the carbon atoms to which they are attached to form a 5 to 7 membered monocyclic ring or 6 to 12 membered bicyclic ring, said ring optionally containing one or more heteroatoms selected from O, N and S, and said rings optionally substituted with one or more groups selected from the group consisting of linear or branched $(C_1-C_8)$alkyl, $(C_6-C_{10})$ aryl, halogen, hydroxy, linear or branched $(C_1-C_8)$ alkoxy and $(C_6-C_{10})$aryloxy.

2. The polyamic acid or polyimide according to claim 1, wherein X is selected from the group consisting of:

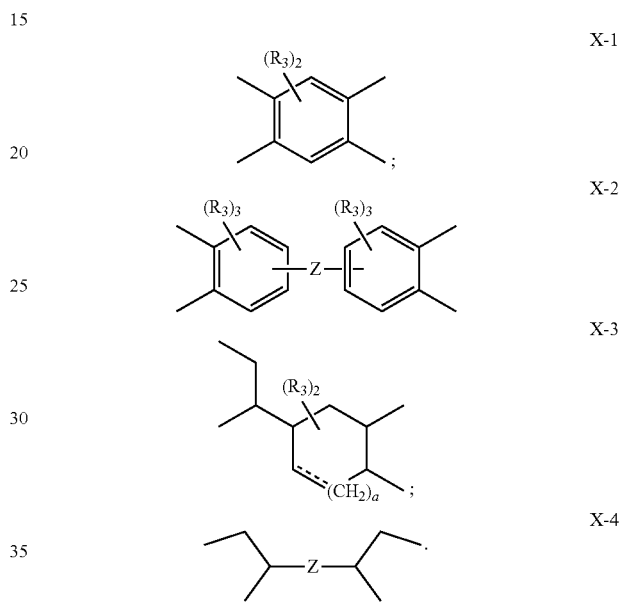

wherein
a is an integer from 0 to 4, inclusive;
⸺ is a single bond or a double bond;
each of $R_3$ is independently selected from the group consisting of hydrogen, methyl, ethyl, linear or branched $(C_3-C_6)$alkyl, trifluoromethyl, pentafluoroethyl, linear or branched perfluoro$(C_3-C_6)$alkyl, methoxy, ethoxy, linear or branched $(C_3-C_6)$alkyloxy, $(C_2-C_6)$acyl, $(C_2-C_6)$acyloxy, phenyl and phenoxy;
Z is a divalent group selected from the group consisting of: $(CR_4R_5)_b$, $O(CR_4R_5)_b$, $(CR_4R_5)_bO$, $(OCR_4R_5)_d$, $(CR_4R_5O)_d$, $(CR_4R_5)_b$—O—$(CR_4R_5)_c$, $(CR_4R_5)_b$—O—$(SiR_4R_5)_c$, $(CR_4R_5)_b$—(CO)O—$(CR_4R_5)_c$, $(CR_4R_5)_b$—O(CO)—$(CR_4R_5)_c$, $(CR_4R_5)_b$—(CO)—$(CR_4R_5)_c$, $(CR_4R_5)_b$—(CO)NH—$(CR_4R_5)_c$, $(CR_4R_5)_b$—NH(CO)—$(CR_4R_5)_c$, $(CR_4R_5)_b$—NH—$(CR_4R_5)_c$, where b and c are integers which may be the same or different and each independently is 0 to 12, and d is an integer from 1 to 12, inclusive;
$R_4$ and $R_5$ are the same or different and each independently selected from the group consisting of hydrogen, methyl, ethyl, linear or branched $(C_3-C_6)$alkyl, trifluoromethyl, pentafluoroethyl, linear or branched perfluoro$(C_3-C_6)$alkyl, methoxy, ethoxy, linear or branched $(C_3-C_6)$alkyloxy, $(C_2-C_6)$acyl, $(C_2-C_6)$acyloxy, phenyl and phenoxy.

3. The polyamic acid or polyimide according to claim 1, wherein X is derived from one or more dianhydrides selected from the group consisting of:

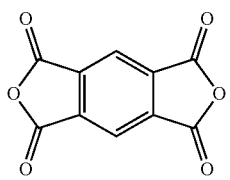

1H,3H-benzo[1,2-c:4,5-c']difuran-1,3,5,7-tetraone (PMDA);

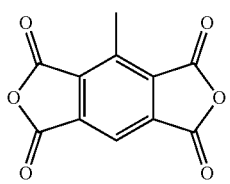

4-methyl-1H,3H-benzo[1,2-c:4,5-c']difuran-1,3,5,7-tetraone;

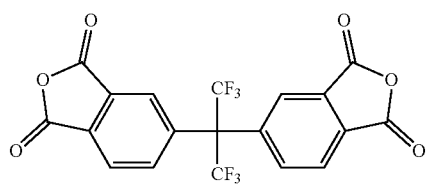

5,5'-(perfluoropropane-2,2-diyl)bis(isobenzofuran-1,3-dione) (6FDA);

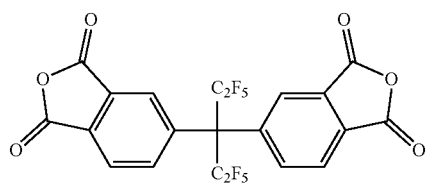

5,5'-(perfluoroentane-3,3-diyl)bis(isobenzofuran-1,3-dione);

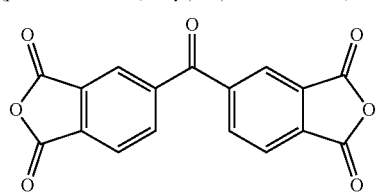

5,5'-carbonylbis(isobenzofuran-1,3-dione) (BTDA);

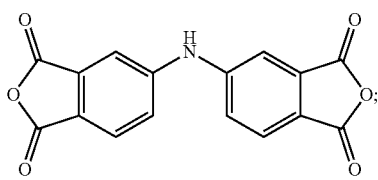

5,5'-azanediylbis(isobenzofuran-1,3-dione)

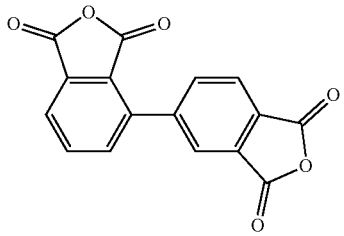

[4,5'-biisobenzofuran]-1,1',3,3'-tetraone (α-BPDA);

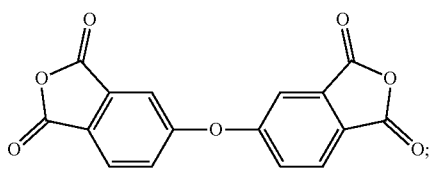

5,5'-oxybis(isobenzofuran-1,3-dione) (ODPA)

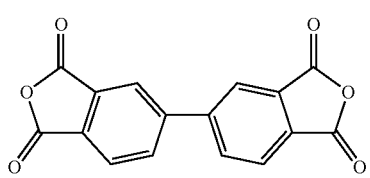

[5,5'-biisobenzofuran]-1,1',3,3'-tetraone (α-BPDA); and

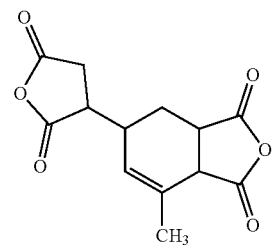

5-(2,5-dioxotetrahydrofuran-3-yl)-7-methyl-3a,4,5,7a-tetrahydroisobenzofuran-1,3-dione (D1901)

4. The polyamic acid or polyimide according to claim 1, wherein Y is derived from one or more diamines selected from the group consisting of:

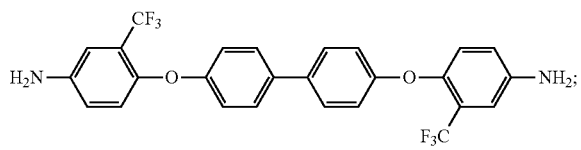

4,4'-([1,1'-biphenyl]-4,4'-diylbis(oxy))bis(3-trifluoromethyl)aniline) (6BF)

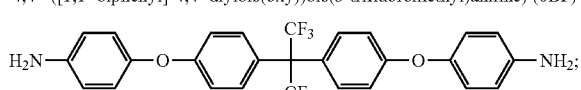

4,4'-(((perfluoropropane-2,2-diyl)bis(4,1-phenylene))bis(oxy))dianiline (HFBAPP)

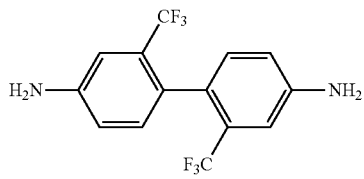

2,2'-bis(trifluoromethyl)-[1,1'-biphenyl]-4,4'-diamine (PFMB);

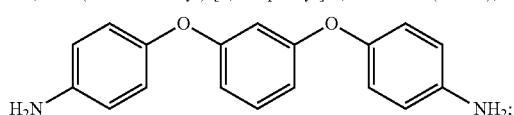

4,4'-(1,3-phenylenebis(oxy))dianiline (APB)

-continued

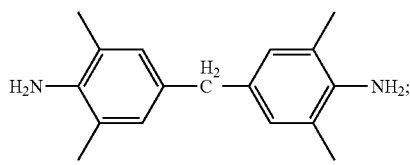

4,4'-methylenebis(2,6-dimethylaniline) (DO3)

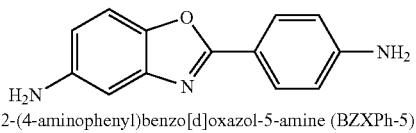

2-(4-aminophenyl)benzo[d]oxazol-5-amine (BZXPh-5);

; and bicyclo[2.2.1]heptane-2,5-diyldimethanamine (NBDA) a diamine of formula (IIIA)

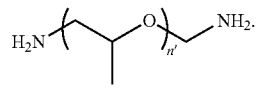

(III) where, n' = 2 to 6 (JD-230)

5. The polyamic acid or polyimide according to claim 1, wherein the end cap is derived from a compound of formula (II):

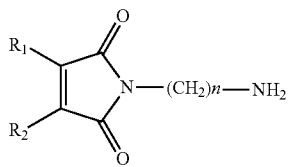

wherein n, $R_1$ and $R_2$ are as defined in claim 1.

6. The polyimide according to claim 5, wherein the compound of formula (II) is selected from the group consisting of:

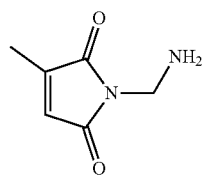

1-(aminomethyl)-3-methyl-1H-pyrrole-2,5-dione;

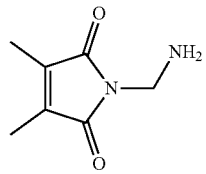

1-(aminomethyl)-3,4-dimethyl-1H-pyrrole-2,5-dione;

-continued

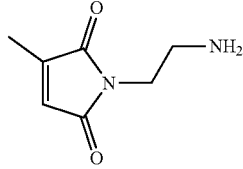

1-(2-aminoethyl)-3-methyl-1H-pyrrole-2,5-dione;

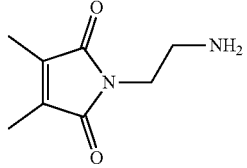

1-(2-aminoethyl)-3,4-dimethyl-1H-pyrrole-2,5-dione (DMMIEt-NH$_2$);

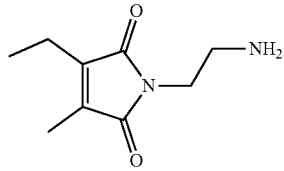

1-(2-aminoethyl)-3-ethyl-4-methyl-1H-pyrrole-2,5-dione ; and

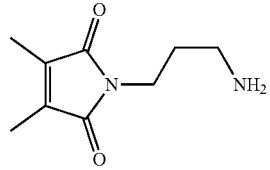

1-(3-aminopropyl)-3,4-dimethyl-1H-pyrrole-2,5-dione.

7. The polyimide according to claim 1, which is selected from the group consisting of:

a polyimide formed from 5,5'-(perfluoropropane-2,2-diyl) bis(isobenzofuran-1,3-dione) (6FDA), 4,4'-([1,1'-biphenyl]-4,4'-diylbis(oxy))bis(3-(trifluoromethyl)aniline) (6BF), 2-(4-aminophenyl)benzo[d]oxazol-5-amine (BZXPh-5) and 1-(2-aminoethyl)-3,4-dimethyl-1H-pyrrole-2,5-dione (DMMIEt-NH$_2$);

a polyimide formed from 5,5'-(perfluoropropane-2,2-diyl) bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and 1-(2-aminoethyl)-3,4-dimethyl-1H-pyrrole-2,5-dione (DMMIEt-NH$_2$);

a polyimide formed from 5,5'-(perfluoropropane-2,2-diyl) bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 4,4'-methylenebis(2,6-dimethylaniline) (DO3) and 1-(2-aminoethyl)-3,4-dimethyl-1H-pyrrole-2,5-dione (DMMIEt-NH$_2$);

a polyimide formed from 5,5'-(perfluoropropane-2,2-diyl) bis(isobenzofuran-1,3-dione) (6FDA), 4,4'-([1,1'-biphenyl]-4,4'-diylbis(oxy))bis(3-(trifluoromethyl)aniline) (6BF), bicyclo[2.2.1]heptane-2,5-diyldimethanamine (NBDA) and 1-(2-aminoethyl)-3,4-dimethyl-1H-pyrrole-2,5-dione (DMMIEt-NH$_2$);

a polyimide formed from 5,5'-(perfluoropropane-2,2-diyl) bis(isobenzofuran-1,3-dione) (6FDA), 4,4'-([1,1'-biphenyl]-4,4'-diylbis(oxy))bis(3-(trifluoromethyl)aniline) (6BF), a diamine of formula (III) (JD-230), 2-(4- aminophenyl)benzo[d]oxazol-5-amine (BZXPh-5) and 1-(2-aminoethyl)-3,4-dimethyl-1H-pyrrole-2,5-dione (DMMIEt-NH$_2$);

a polyimide formed from 1H,3H-benzo[1,2-c:4,5-c']difuran-1,3,5,7-tetraone (PMDA), 4,4'-(1,3-phenylenebis(oxy))dianiline (APB), a diamine of formula (III) (JD-230) and 1-(2-aminoethyl)-3,4-dimethyl-1H-pyrrole-2,5-dione (DMMIEt-NH$_2$); and a polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-(((perfluoropropane-2,2-diyl)bis(4,1-phenylene))bis(oxy))dianiline (HFBAPP), 2,2'-bis(trifluoromethyl)-[1,1'-biphenyl]-4,4'-diamine (PFMB) and 1-(2-aminoethyl)-3,4-dimethyl-1H-pyrrole-2,5-dione (DMMIEt-NH$_2$).

8. The polyamic acid or polyimide according to claim 1 having a weight average molecular weight (M$_w$) of at least 5,000.

9. The polyamic acid or polyimide according to claim 1 which is soluble in an organic solvent, wherein the organic solvent is selected from the group consisting of N-methyl-2-pyrrolidone (NMP), γ-butyrolactone (GBL), N,N-dimethylacetamide (DMAc), propylene glycol monomethyl ether acetate (PGMEA), dimethyl sulfoxide (DMSO), cyclopentanone, cyclohexanone, 2-butanone and 2-heptanone and mixtures in any combination thereof.

10. A composition comprising:
a) an end capped polyamic acid of the formula (IA) or an end capped polyimide of the formula (IB):

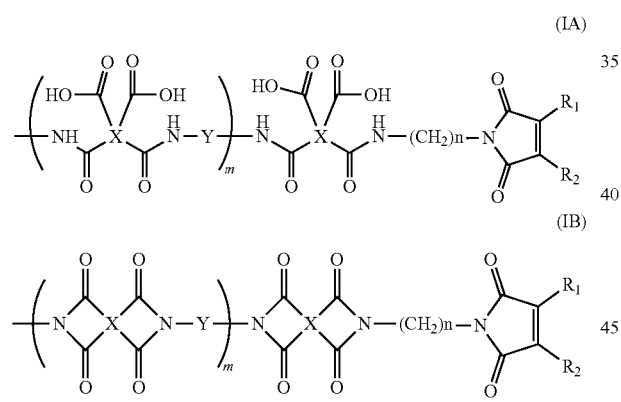

wherein:
m is an integer of at least 50; (from 50 to 2000, inclusive);
n is an integer from 1 to 12, inclusive;
X is one or more distinct tetravalent organic group;
Y is one or more distinct divalent organic group, wherein Y is derived from one or more diamines selected from the group consisting of:

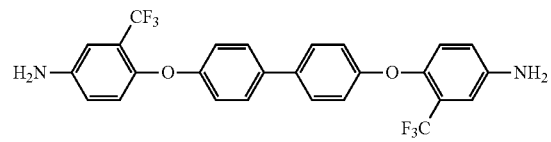

4,4'-([1,1'-biphenyl]-4,4'-diylbis(oxy))bis(3-(trifluoromethyl)aniline) (6BF);

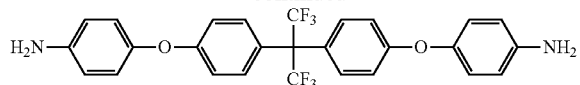

4,4'-(((perfluoropropane-2,2-diyl)bis(4,1-phenylene))bis(oxy))dianiline (HFBAPP);

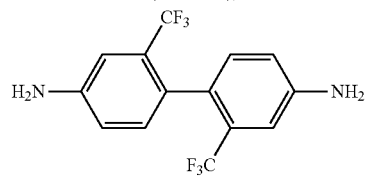

2,2'-bis(trifluoromethyl)-[1,1'-biphenyl]-4,4'-diamine (PFMB);

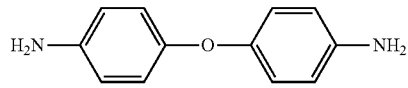

4,4'-oxydianiline (4,4'-ODA);

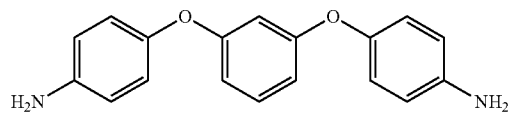

4,4'-(1,3-phenylenebis(oxy))dianiline (APB);

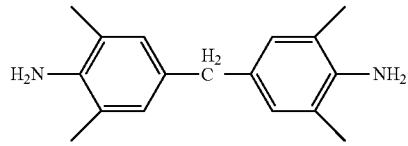

4,4'-methylenebis(2,6-dimethylaniline) (DO3);

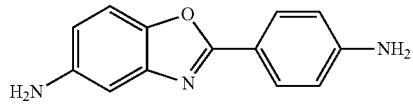

2-(4-aminophenyl)benzo[d]oxazol-5-amine (BZXPh-5);

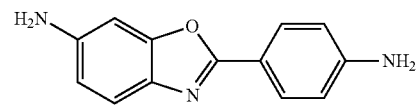

2-(4-aminophenyl)benzo[d]oxazol-6-amine (BZXPh-6);

benzo[d]oxazole-2,5-diamine (BZX-5);

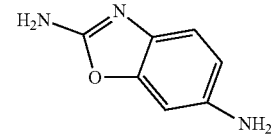

benzo[d]oxazole-2,6-diamine (BZX-6);

bicyclo[2.2.1]heptane-2,5-diyldimethanamine (NBDA);
a diamine of formula (III)

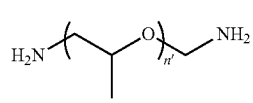

where, n' = 2 to 6 (JD-230);

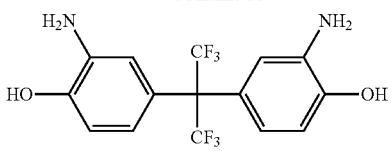

4,4'-(perfluoropropane-2,2-diyl)bis(2-aminophenol) (BAFA); and

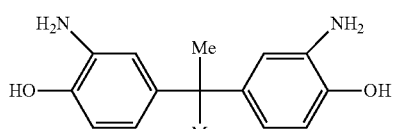

4,4'-(propane-2,2-diyl)bis(2-aminophenol) (DABPA); and $R_1$ and $R_2$ are the same or different and each independently of one another selected from the group consisting of hydrogen, linear or branched $(C_1\text{-}C_{16})$alkyl, hydroxy$(C_1\text{-}C_{12})$alkyl, perfluoro$(C_1\text{-}C_{12})$alkyl, $(C_6\text{-}C_{10})$aryl and $(C_6\text{-}C_{10})$aryl$(C_1\text{-}C_3)$alkyl provided that both $R_1$ and $R_2$ are not hydrogen; or $R_1$ and $R_2$ taken together with the carbon atoms to which they are attached to form a 5 to 7 membered monocyclic ring or 6 to 12 membered bicyclic ring, said ring optionally containing one or more heteroatoms selected from O, N and S, and said rings optionally substituted with one or more groups selected from the group consisting of linear or branched $(C_1\text{-}C_8)$alkyl, $(C_6\text{-}C_{10})$aryl, halogen, hydroxy, linear or branched $(C_1\text{-}C_8)$alkoxy and $(C_6\text{-}C_{10})$aryloxy; and b) a photo radical generator.

11. The composition according to claim 10, wherein the polyamic acid or polyimide is derived from one or more dianhydrides selected from the group consisting of:

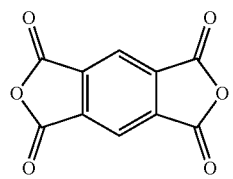

1H,3H-benzo[1,2-c:4,5-c']difuran-1,3,5,7-tetraone (PMDA);

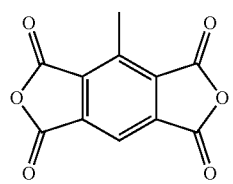

4-methyl-1H,3H-benzo[1,2-c:4,5-c']difuran-1,3,5,7-tetraone;

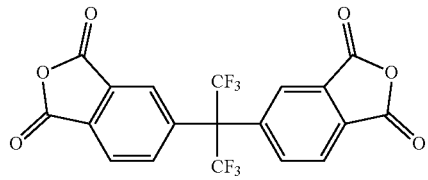

5,5'-(perfluoropropane-2,2-diyl)bis(isobenzofuran-1,3-dione) (6FDA);

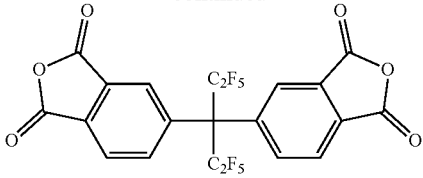

5,5'-(perfluoroentane-3,3-diyl)bis(isobenzofuran-1,3-dione);

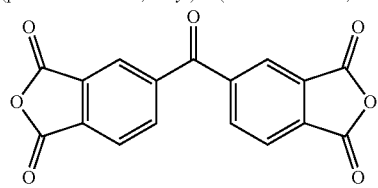

5,5'-carbonylbis(isobenzofuran-1,3-dione) (BTDA);

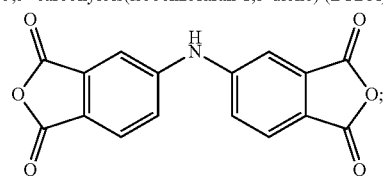

5,5'-azanediylbis(isobenzofuran-1,3-dione)

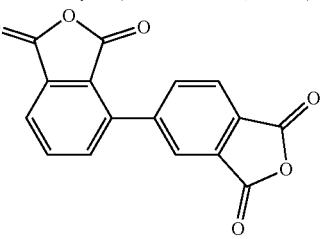

[4,5'-biisobenzofuran]-1,1',3,3'-tetraone (α-BPDA);

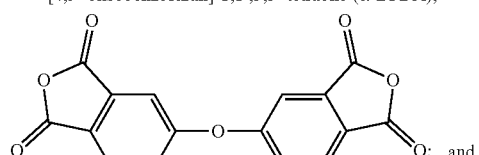

5,5'-oxybis(isobenzofuran-1,3-dione) (ODPA); and

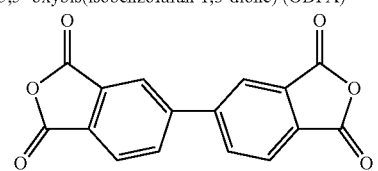

[5,5'-biisobenzofuran]-1,1',3,3'-tetraone (BPDA).

12. The composition according to claim 10, wherein the polyamic acid or the polyimide is derived from one or more diamines selected from the group consisting of:

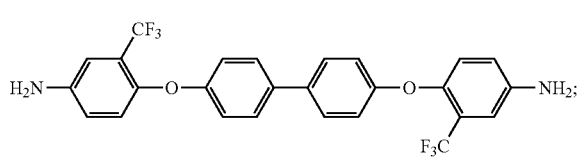

4,4'-([1,1'-biphenyl]-4,4'-diylbis(oxy))bis(3-trifluoromethyl)aniline) (6BF)

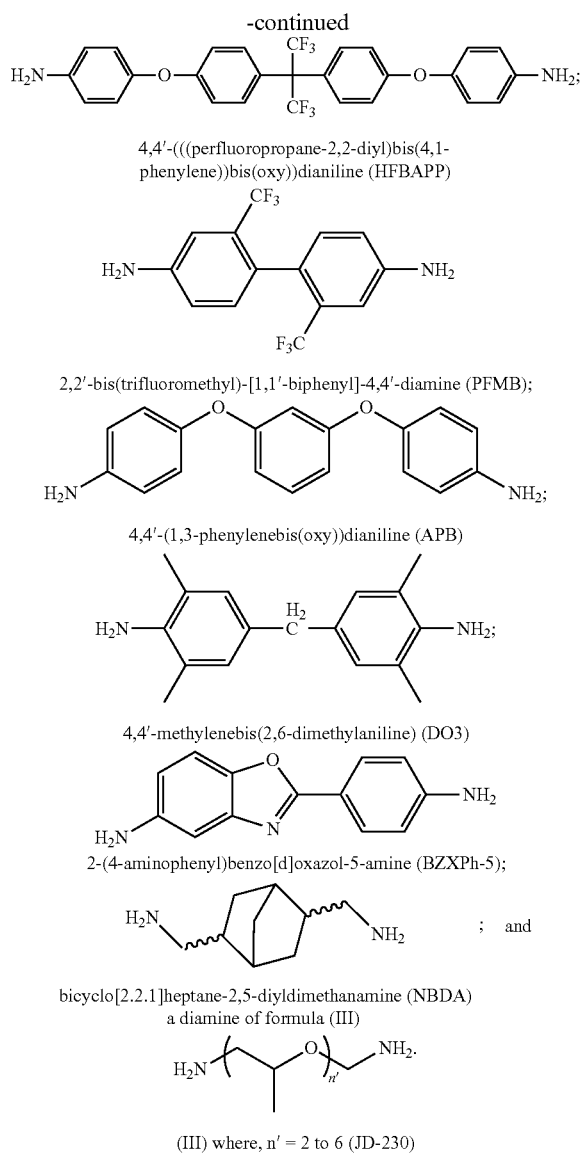

4,4'-(((perfluoropropane-2,2-diyl)bis(4,1-phenylene))bis(oxy))dianiline (HFBAPP)

2,2'-bis(trifluoromethyl)-[1,1'-biphenyl]-4,4'-diamine (PFMB);

4,4'-(1,3-phenylenebis(oxy))dianiline (APB)

4,4'-methylenebis(2,6-dimethylaniline) (DO3)

2-(4-aminophenyl)benzo[d]oxazol-5-amine (BZXPh-5);

bicyclo[2.2.1]heptane-2,5-diyldimethanamine (NBDA) a diamine of formula (III)

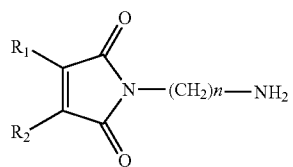

(III) where, n' = 2 to 6 (JD-230)

13. The composition according to claim 10, wherein at least one end of the main chain of the polyamic acid or the polyimide is end capped with a compound of formula (II):

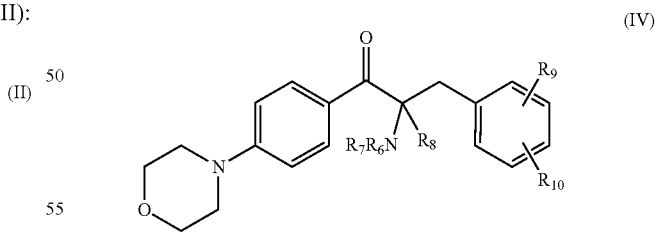

wherein n, $R_1$ and $R_2$ are as defined in claim 10.

14. The composition according to claim 10, wherein the polyimide is selected from the group consisting of:

a polyimide formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), 2-(4-aminophenyl)benzo[d]oxazol-5-amine (BZXPh-5) and 1-(2-aminoethyl)-3,4-dimethyl-1H-pyrrole-2,5-dione (DMMIEt-NH₂);

a polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and 1-(2-aminoethyl)-3,4-dimethyl-1H-pyrrole-2,5-dione (DMMIEt-NH₂);

a polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 4,4'-methylenebis(2,6-dimethylaniline) (DO3) and 1-(2-aminoethyl)-3,4-dimethyl-1H-pyrrole-2,5-dione (DMMIEt-NH₂);

a polyimide formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), bicyclo[2.2.1]heptane-2,5-diyldimethanamine (NBDA) and 1-(2-aminoethyl)-3,4-dimethyl-1H-pyrrole-2,5-dione (DMMIEt-NH₂);

a polyimide formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), a diamine of formula (III) (JD-230), 2-(4-aminophenyl)benzo[d]oxazol-5-amine (BZXPh-5) and 1-(2-aminoethyl)-3,4-dimethyl-1H-pyrrole-2,5-dione (DMMIEt-NH₂);

a polyimide formed from 1H,3H-benzo[1,2-c:4,5-c']difuran-1,3,5,7-tetraone (PMDA), 4,4'-(1,3-phenylenebis(oxy))dianiline (APB), a diamine of formula (III) (JD-230) and 1-(2-aminoethyl)-3,4-dimethyl-1H-pyrrole-2,5-dione (DMMIEt-NH₂); and a polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-(((perfluoropropane-2,2-diyl)bis(4,1-phenylene))bis(oxy))dianiline (HFBAPP), 2,2'-bis(trifluoromethyl)[1,1'-biphenyl]-4,4'-diamine (PFMB) and 1-(2-aminoethyl)-3,4-dimethyl-1H-pyrrole-2,5-dione (DMMIEt-NH₂).

15. The composition according to claim 10, wherein the photo radical generator is selected from the group consisting of:

a compound of formula (IV):

(IV)

wherein $R_6$ and $R_7$ are the same or different and each independently of one another selected from the group consisting of hydrogen, linear or branched $(C_1-C_8)$alkyl and $(C_6-C_{10})$aryl; or $R_6$ and $R_7$ taken together with the nitrogen atom to which they are attached to form a 5 to 7 membered monocyclic ring or 6 to 12 membered bicyclic ring, said ring optionally containing one or more heteroatoms selected from 0 and N, and said ring optionally substituted with linear or branched (C$_1$-C$_8$)alkyl, (C$_6$-C$_{10}$)aryl, halogen, hydroxy, linear or branched (C$_1$-C$_8$)alkoxy and (C$_6$-C$_{10}$)aryloxy; and R$_8$, R$_9$ and R$_{10}$ are the same or different and each independently of one another is selected from the group consisting of hydrogen, linear or branched (C$_1$-C$_{16}$)alkyl, (C$_6$-C$_{10}$)aryl, (C$_6$-C$_{10}$)aryl(C$_1$-C$_3$)alkyl, hydroxy, halogen, linear or branched (C$_1$-C$_{12}$)alkoxy and (C$_6$-C$_{10}$)aryloxy; and a compound of formula (V):

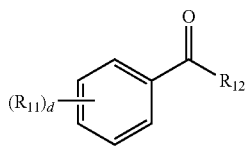

(V)

wherein d is an integer from 0 to 3, inclusive;

R$_{11}$ is selected from the group consisting of hydrogen, linear or branched (C$_1$-C$_{16}$)alkyl, (C$_6$-C$_{10}$)aryl, (C$_6$-C$_{10}$)aryl(C$_1$-C$_3$)alkyl, hydroxy, halogen, linear or branched (C$_1$-C$_{12}$)alkoxy and (C$_6$-C$_{10}$)aryloxy;

R$_{12}$ is selected from the group consisting of linear or branched (C$_1$-C$_{16}$)alkyl, (C$_3$-C$_8$)cycloalkyl, (C$_6$-C$_{10}$)aryl, (C$_6$-C$_{10}$)aryl(C$_1$-C$_3$)alkyl, (C$_6$-C$_{10}$)aryl(C$_1$-C$_6$)alkylphosphinate, (C$_6$-C$_{10}$)heterocycle(C$_1$-C$_3$)alkyl, a group of formula C(O)—(OCH$_2$CH$_2$)$_e$—OC(O)C(O)(C$_6$-C$_{10}$)aryl, where e is an integer from 2 to 4, inclusive, C(O)C(O)O(C$_1$-C$_3$)alkyl and a group of formula (C):

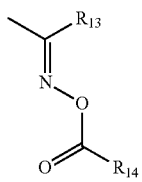

wherein

R$_{13}$ is linear or branched (C$_1$-C$_{16}$)alkyl; and

R$_{14}$ is (C$_6$-C$_{10}$)aryl;

and where each of said alkyl, cycloalkyl, aryl and heterocycle may additionally be substituted with one or more groups selected from the group consisting of hydroxy, linear or branched (C$_1$-C$_6$)alkyl, linear or branched (C$_1$-C$_6$)alkoxy and linear or branched thio(C$_1$-C$_6$)alkyl.

16. The composition according to claim 10, wherein the photo radical generator is selected from the group consisting of:

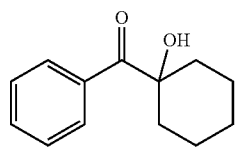

(1-hydroxycyclohexyl)(phenyl)methanone;

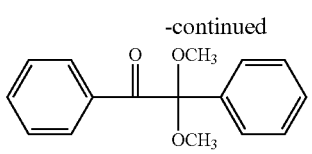

2,2-dimethoxy-1,2-diphenylethan-1-one;

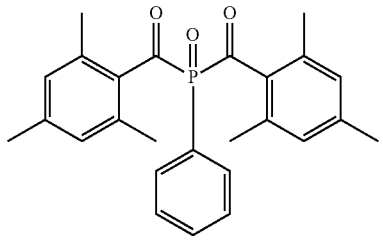

(phenylphosphoryl)bis(mesitylmethanone);

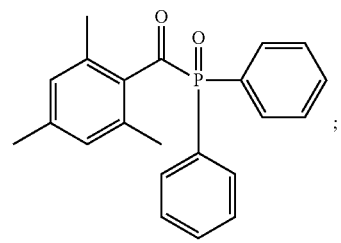

(diphenylphosphoryl)(mesityl)methanone

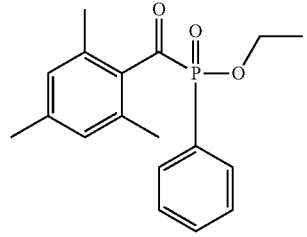

ethyl phenyl(2,4,6-trimethylbenzoyl)phosphinate;

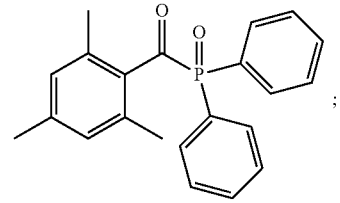

(diphenylphosphoryl)(mesityl)methanone

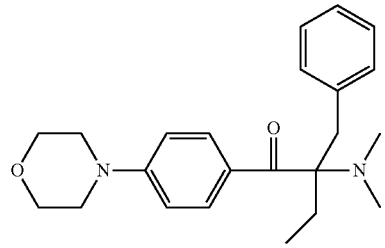

2-benzyl-2-(dimethylamino)-1-(4-morpholinophenyl)butan-1-one;

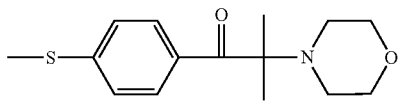

2-methyl-1-(4-(methylthio)phenyl)-2-morpholinopropan-1-one;

-continued

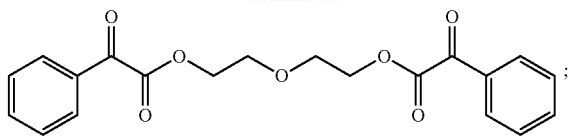

oxybis(ethane-2,1-diyl) bis(2-oxo-2-phenylacetate)

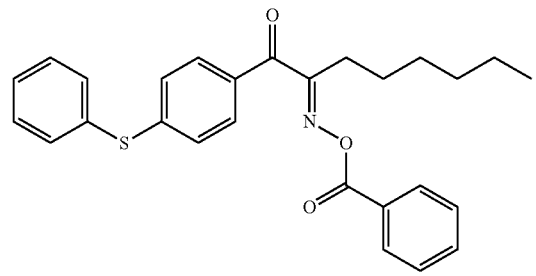

(E)-2-((benzoyloxy)imino)-1-(4-(phenylthio)phenyl)octan-1-one

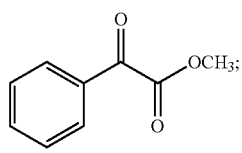

methyl 2-oxo-2-phenylacetate

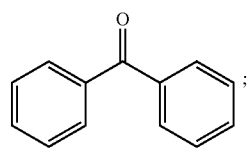

benzophenone)

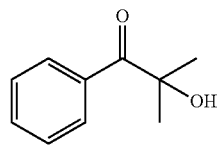

2-hydroxy-2-methyl-1-phenylpropan-1-one;

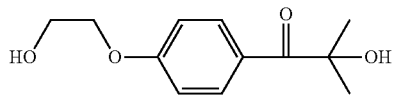

2-hydroxy-1-(4-(2-hydroxyethoxy)phenyl)-2-methylpropan-1-one;

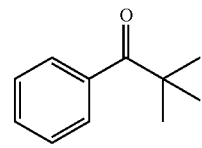

2,2-dimethyl-1-phenylpropan-1-one;

and a mixture in any combination thereof.

17. The composition according to claim 10, further comprising one or more photo sensitizers, which is of the formula (VI):

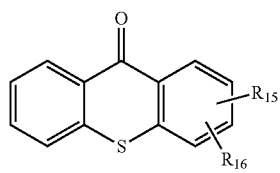

(VI)

wherein $R_{15}$ and $R_{16}$ are the same or different and independently of each other selected from the group consisting of hydrogen, halogen, methyl, ethyl, linear or branched ($C_3$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_3$)alkyl, ($C_1$-$C_{12}$)alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$) aryloxy($C_1$-$C_3$)alkyl and ($C_6$-$C_{10}$)-aryloxy.

18. The composition according to claim 17, wherein the photosensitizer is selected from the group consisting of:

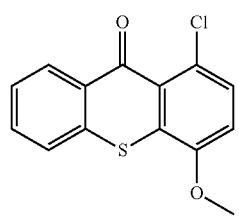

1-chloro-4-methoxy-9H-thioxanthen-9-one;

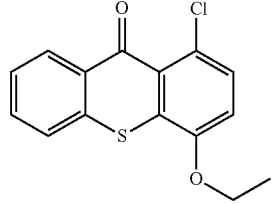

1-chloro-4-ethoxy-9H-thioxanthen-9-one;

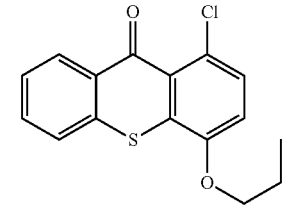

1-chloro-4-propoxy-9H-thioxanthen-9-one;

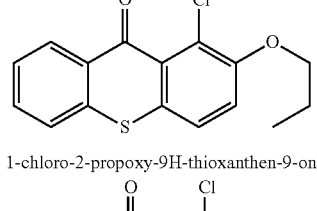

1-chloro-2-propoxy-9H-thioxanthen-9-one;

1-chloro-2-ethoxy-9H-thioxanthen-9-one;

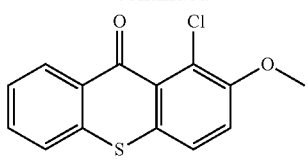

1-chloro-2-methoxy-9H-thioxanthen-9-one;

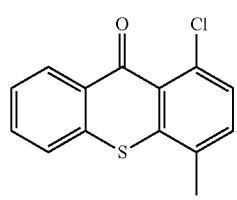

1-chloro-4-methyl-9H-thioxanthen-9-one;

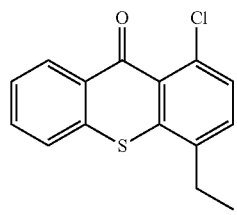

1-chloro-4-ethyl-9H-thioxanthen-9-one;

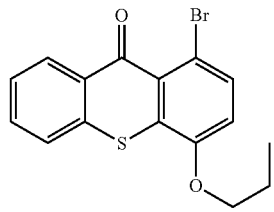

1-bromo-4-propoxy-9H-thioxanthen-9-one;

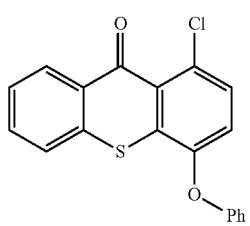

1-chloro-4-phenoxy-9H-thioxanthen-9-one;

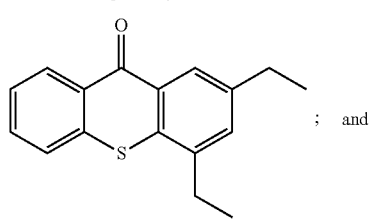

2,4-diethyl-9H-thioxanthen-9-one

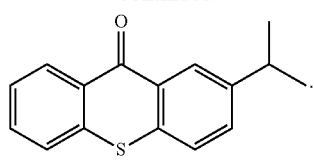

2,isopropyl-9H-thioxanthen-9-one

19. The composition according to claim 10, further comprising one or more crosslinking agent selected from the group consisting of:

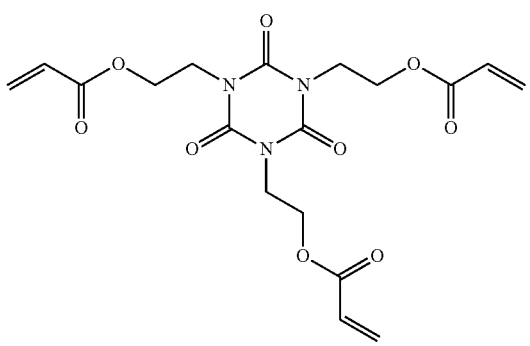

(2,4,6-trioxo-1,3,5-triazinane-1,3,5-triyl)tris(ethane-2,1-diyl) triacrylate (TAEICY)

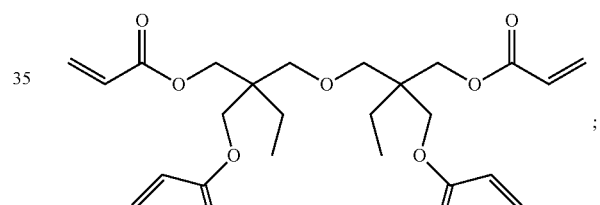

(oxybis(methylene))bis(2-ethylpropane-2,1,3-triyl) tetraacrylate (BTMPTA)

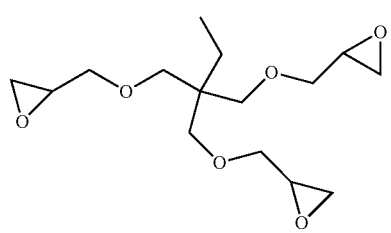

2,2'-(((2-ethyl-2-((oxiran-2-ylmethoxy)methyl)propane-1,3-diyl)bis(oxy))bis(methylene))bis(oxirane) (TMPTGE);

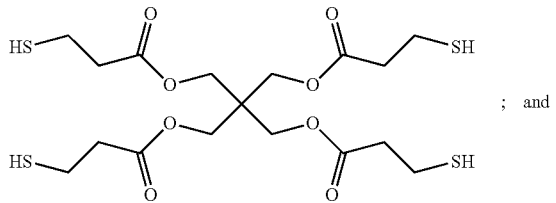

2,2-bis(((3-mercaptopropanoyl)oxy)methyl)propane-1,3-diyl bis(3-mercaptopropanoate) (PET3MP)

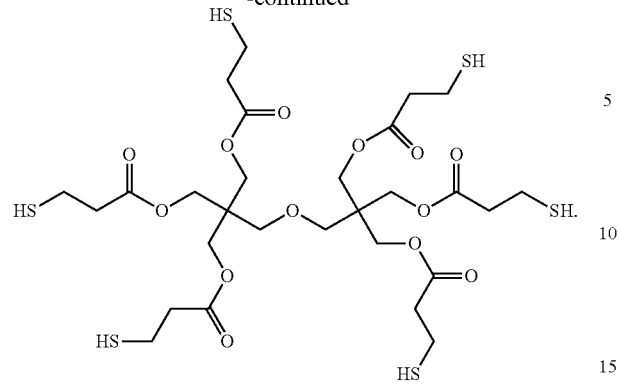
2,2,2',2'-tetrakis(3-mercaptopropanoyl)-3,3'(3-mercaptopropanoyl)-1,1'-dipropyl ether
(DPEH3MP)
20. A cured product comprising the composition of claim 10.
* * * * *